(12) United States Patent
Hirota et al.

(10) Patent No.: US 10,113,028 B2
(45) Date of Patent: Oct. 30, 2018

(54) EPOXY RESIN, CURABLE RESIN COMPOSITION, CURED PRODUCT, SEMICONDUCTOR ENCAPSULATING MATERIAL, SEMICONDUCTOR DEVICE, PREPREG, CIRCUIT BOARD, BUILDUP FILM, BUILDUP SUBSTRATE, FIBER-REINFORCED COMPOSITE MATERIAL AND FIBER-REINFORCED MOLDED ARTICLE

(71) Applicant: DIC Corporation, Tokyo (JP)

(72) Inventors: Yousuke Hirota, Chiba (JP); Takamitsu Nakamura, Chiba (JP); Yutaka Satou, Chiba (JP)

(73) Assignee: DIC Corporation, Tokyo (JP)

( * ) Notice: Subject to any disclaimer, the term of this patent is extended or adjusted under 35 U.S.C. 154(b) by 32 days.

(21) Appl. No.: 15/321,528

(22) PCT Filed: Jan. 27, 2015

(86) PCT No.: PCT/JP2015/052135
§ 371 (c)(1),
(2) Date: Dec. 22, 2016

(87) PCT Pub. No.: WO2016/002241
PCT Pub. Date: Jan. 7, 2016

(65) Prior Publication Data
US 2017/0240690 A1    Aug. 24, 2017

(30) Foreign Application Priority Data

Jun. 30, 2014 (JP) .................... 2014-134162

(51) Int. Cl.
*C08G 59/08*     (2006.01)
*C08J 5/24*      (2006.01)
(Continued)

(52) U.S. Cl.
CPC ............... *C08G 59/08* (2013.01); *C08J 5/10* (2013.01); *C08J 5/24* (2013.01); *C08K 5/1545* (2013.01);
(Continued)

(58) Field of Classification Search
None
See application file for complete search history.

(56) References Cited

U.S. PATENT DOCUMENTS

| | | | |
|---|---|---|---|
| 2003/0092852 A1* | 5/2003 | Ogura | C07D 311/78 525/403 |
| 2016/0369032 A1* | 12/2016 | Satou | C07D 307/77 |
| 2016/0369041 A1* | 12/2016 | Satou | C08J 5/24 |

FOREIGN PATENT DOCUMENTS

| | | |
|---|---|---|
| JP | 62-020206 A | 1/1987 |
| JP | 05-093034 A | 4/1993 |
| JP | 05-093035 A | 4/1993 |

OTHER PUBLICATIONS

English language machine translation of JP 05-093035. Japanese document published Apr. 16, 1993.*

(Continued)

*Primary Examiner* — Megan McCulley
(74) *Attorney, Agent, or Firm* — McDermott Will & Emery LLP

(57) ABSTRACT

An epoxy resin exhibits a small change in volume after thermal history, is excellent in low thermal expansion and low moisture absorption, and has high heat resistance, in terms of a cured product obtained therefrom; a curable resin composition; a cured product which has all the above properties; a semiconductor encapsulating material; a semiconductor device; a prepreg; a circuit board; a buildup film; a buildup substrate; a fiber-reinforced composite material; and a molded article. The present invention is characterized by an epoxy resin, characterized by including as essential components, a cresol-naphthol co-condensed novolac type epoxy resin (A), a naphthol glycidyl ether compound (B), and one or more xanthene compounds (C) selected from the group of compounds represented by the following structural formulae (1) to (3), wherein the content of the xanthene compound(s) (C) is from 0.1% to 5.5% in terms of area ratio in a GPC measurement.

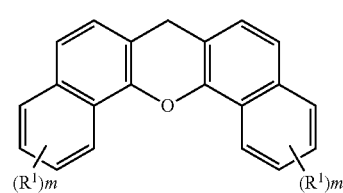

(1)

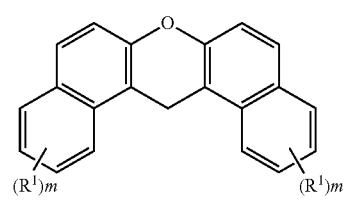

(2)

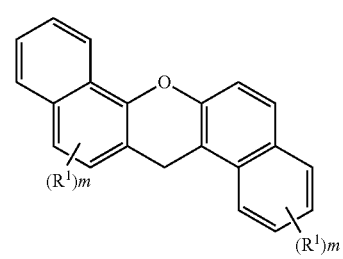

(3)

13 Claims, 5 Drawing Sheets

(51) Int. Cl.
*C08K 5/1545* (2006.01)
*C08L 63/00* (2006.01)
*C08J 5/10* (2006.01)
*H01L 21/56* (2006.01)
*H01L 23/29* (2006.01)
*H05K 1/03* (2006.01)
*H05K 3/02* (2006.01)
*H05K 3/18* (2006.01)
*H05K 3/46* (2006.01)

(52) U.S. Cl.
CPC ............ *C08L 63/00* (2013.01); *H01L 21/565* (2013.01); *H01L 23/293* (2013.01); *H05K 1/0326* (2013.01); *H05K 1/0366* (2013.01); *H05K 3/022* (2013.01); *H05K 3/18* (2013.01); *H05K 3/4676* (2013.01); *C08J 2363/04* (2013.01); *H05K 2201/0959* (2013.01)

(56) References Cited

OTHER PUBLICATIONS

English language machine translation of JP 05-093034. Japanese document published Apr. 16, 1993.*
Search Report issued in corresponding International Patent Application No. PCT/JP2015/052135, dated Apr. 21, 2015.

* cited by examiner

EPOXY RESIN, CURABLE RESIN COMPOSITION, CURED PRODUCT, SEMICONDUCTOR ENCAPSULATING MATERIAL, SEMICONDUCTOR DEVICE, PREPREG, CIRCUIT BOARD, BUILDUP FILM, BUILDUP SUBSTRATE, FIBER-REINFORCED COMPOSITE MATERIAL AND FIBER-REINFORCED MOLDED ARTICLE

CROSS REFERENCE

This application is the U.S. National Phase under 35 U.S.C. § 371 of International Application No. PCT/JP2015/052135, filed on Jan. 27, 2015, which claims the benefit of Japanese Application No. 2014-134162, filed on Jun. 30, 2014, the entire contents of each are hereby incorporated by reference.

TECHNICAL FIELD

The present invention relates to: an epoxy resin which, in a cured product obtained therefrom, exhibits a small change in volume after thermal history, is excellent in low thermal expansion and low moisture absorption, and can exhibit high heat resistance; a curable resin composition; a cured product which has all of the above properties; a semiconductor encapsulating material; a semiconductor device; a prepreg; a circuit board; a buildup film; a buildup substrate; a fiber-reinforced composite material; and a fiber-reinforced molded article.

BACKGROUND ART

Curable resin compositions including an epoxy resin and a phenolic hydroxy group-containing resin are used in an adhesive, a molding material, a paint, a photoresist material, a color developing material, and the like, and in addition, widely used in the electric and electronic field as a semiconductor encapsulating material, an insulating material for printed wiring board, and the like due to the fact that a cured product obtained therefrom is excellent in properties such as heat resistance and moisture resistance.

In the field of printed wiring board among the various applications, with a movement toward smaller size and higher performance of electronic devices, a tendency to increase the density of semiconductor devices by narrowing wiring pitch is remarkable, and as a semiconductor mounting method in response to the situation, a flip-chip connection method in which a semiconductor device and a substrate are bonded via a solder ball is widely used. The flip-chip connection method is a semiconductor mounting method according to a so-called reflow method in which a solder ball is placed between a wiring board and a semiconductor and then all the components are heated to melt-bond the components, and therefore the wiring board is exposed to a highly-heated environment during reflowing the solder. For this reason, when the wiring board thermally shrinks in the highly-heated environment, a large stress may occur on the solder ball which connects the wiring board and the semiconductor to cause connection failure of wirings. Accordingly, a material having a low thermal expansion coefficient is demanded for an insulating material to be used in a printed wiring board.

In the field of semiconductor encapsulating material, the temperature in the reflow processing has been increased due to a shift to lead-free solder, and improvement in solder clack resistance (reflowability) is demanded. Thus, as a semiconductor encapsulating material, a material exhibiting high heat resistance and low moisture absorption rate in terms of its cured product is demanded.

In addition, in recent years, a lead-free solder having a high melting point has become a main stream owing to legal regulation for environmental issues and the like, and therefore, a temperature for reflow has been increased. Under the situation, connection failure due to warpage of a printed wiring board caused by a change in volume of an insulating material during reflow has become a serious problem. Accordingly, a material which shows a small change in volume after thermal history is demanded.

In order to meet the demands, for example, PTL 1 describes that a thermosetting resin composition containing as a main agent a naphthol novolac type epoxy resin which is obtained by reacting naphthol, formaldehyde, and epichlorohydrin solves technical objects such as low thermal expansion.

However, the naphthol novolac type epoxy resin is recognized to exhibit some improvements of a cured product obtained therefrom in heat resistance, thermal expansion coefficient, and moisture absorption rate as compared with a general phenol novolac type epoxy resin, and however, the levels of the high heat resistance, low thermal expansion, and low moisture absorption rate, which have been demanded in recent years, have not been sufficiently satisfied. Furthermore, a cured product obtained from the resin is liable to cause the connection failure of a printed wiring board as mentioned above due to a large change in volume through thermal history.

CITATION LIST

Patent Literature

PTL 1: JP-B-62-20206

SUMMARY OF INVENTION

Technical Problem

Thus, a problem that the present invention is to provide an epoxy resin which exhibits a small change in volume after thermal history, is excellent in low thermal expansion and low moisture absorption, and can exhibit high heat resistance, in terms of a cured product obtained therefrom; a curable resin composition; a cured product which has all the above properties; a semiconductor encapsulating material; a semiconductor device; a prepreg; a circuit board; a buildup film; a buildup substrate; a fiber-reinforced composite material; and a fiber-reinforced molded article.

Solution to Problem

The present inventors intensively studied for solving the above problem, and as a result, they have found that an epoxy resin which includes as essential components, a cresol-naphthol co-condensed novolac type epoxy resin (A), a naphthol glycidyl ether compound (B), and a xanthene compound (C), wherein the content of the xanthene compound is from 0.1% to 5.5% in terms of area ratio in a GPC measurement, shows a small change in volume after thermal history and is excellent in low thermal expansion and low moisture absorption in a cured product thereof, completing the present invention.

Specifically, the present invention relates to an epoxy resin, which is characterized by including as essential components, a cresol-naphthol co-condensed novolac type epoxy resin (A), a naphthol glycidyl ether compound (B), and one or more xanthene compounds (C) selected from the group of compounds represented by the following structural formulae (1) to (3), wherein the content of the xanthene compound(s) is from 0.1% to 5.5% in terms of area ratio in a GPC measurement.

[Chem. 1]

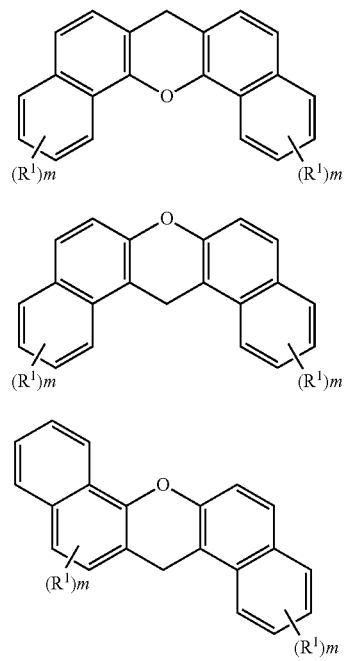

In the structural formulae (1) to (3), $R^1$ each independently represents a hydrogen atom, an alkyl group having 1 to 4 carbon atoms, or an alkoxy group having 1 to 4 carbon atoms, and m each independently represents an integer of 1 to 6.

The present invention further relates to a curable resin composition including as essential components, the epoxy resin and a curing agent.

The present invention further relates to a cured product obtained by subjecting the curable resin composition to a curing reaction.

The present invention further relates to a semiconductor encapsulating material containing the curable resin composition and an inorganic filler.

The present invention further relates to a semiconductor device obtained by subjecting the semiconductor encapsulating material to thermal curing.

The present invention further relates to a prepreg obtained by impregnating a reinforcing substrate with a dilution of the curable resin composition in an organic solvent and semi-curing the obtained impregnated substrate.

The present invention further relates to a circuit board obtained by diluting the curable resin composition in an organic solvent to prepare a varnish, shaping the vanish into a plate, and subjecting the varnish plate and a copper foil to heat and pressure molding.

The present invention further relates to a buildup film obtained by applying a dilution of the curable resin composition in an organic solvent on a substrate film and drying the resultant film.

The present invention further relates to a buildup substrate obtained by applying the buildup film on a circuit board having a circuit formed thereon, subjecting the circuit board to thermal curing, forming unevenness on the resultant circuit board, and then subjecting the circuit board to a plating process.

The present invention further relates to a fiber-reinforced composite material containing the curable resin composition and a reinforcing fiber.

The present invention further relates to a fiber-reinforced molded article obtained by curing the fiber-reinforced composite material.

Advantageous Effects of Invention

According to the present invention, an epoxy resin which exhibits a small change in volume after thermal history, is excellent in low thermal expansion and low moisture absorption, and can exhibit high heat resistance, in terms of a cured product obtained therefrom; a curable resin composition; a cured product which has all the above properties; a semiconductor encapsulating material; a semiconductor device; a prepreg; a circuit hoard; a buildup film; a buildup substrate; and a fiber-reinforced composite material; and a fiber-reinforced molded article, can be produced.

DESCRIPTION OF EMBODIMENT

<Epoxy Resin>

Figure 1:
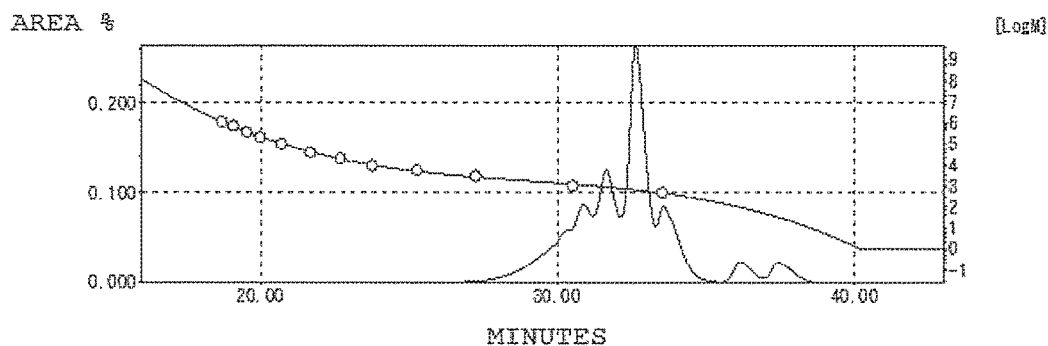
FIG. 1 shows a GPC chart of a phenol resin obtained in Synthetic Example 1.

The present invention is described in detail below.
The epoxy resin of the present invention is characterized by including as essential components, a cresol-naphthol co-condensed novolac type epoxy resin (A), a naphthol glycidyl ether compound (B), and one or more xanthene compounds (C) selected from the group of compounds represented by the following structural formulae (1) to (3), wherein the content of the xanthene compound(s) (C) is from 0.1% to 5.5% in terms of area ratio in a GPC measurement.

[Chem. 2]

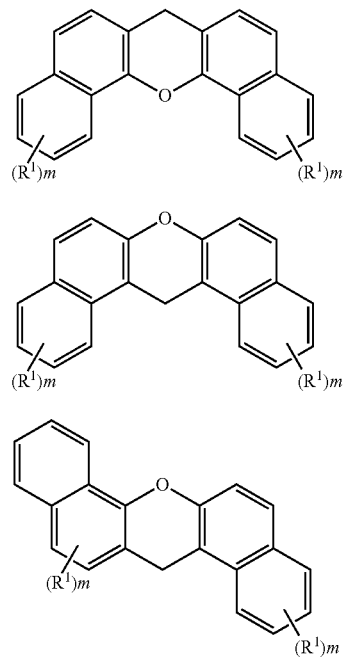

In the structural formulae (1) to (3), $R^1$ each independently represents a hydrogen atom, an alkyl group having 1 to 4 carbon atoms, or an alkoxy group having 1 to 4 carbon atoms, and m each independently represents an integer of 1 to 6.

Examples of the hydrocarbon group having 1 to 4 carbon, atoms represented by $R^1$ include a methyl group, an ethyl group, a propyl group, an isopropyl group, a butyl group, an isobutyl group, and a t-butyl group. Examples of the alkoxy group having 1 to 4 carbon, atoms include a methoxy group, an ethoxy group, a propyloxy group, an isopropyloxy group, a t-propyloxy group, a butoxy group, an isobutyloxy group, and a t-butyloxy group.

Incidentally, among the compounds described above, $R^1$ is preferably a hydrogen atom from the viewpoint that a cured product that is excellent in low thermal expansion and low moisture absorption and exhibits high heat resistance can be obtained.

Specifically, the epoxy resin of the present invention is a mixture containing a cresol-naphthol co-condensed novolac type epoxy resin (A), a naphthol glycidyl ether compound (B), and one or more xanthene compounds (C) selected from the group of compounds represented by the aforementioned structural formulae (1) to (3), and by containing in the mixture, one or more xanthene compounds (C) selected from the group of compounds represented by the structural formulae (1) to (3) in 0.1% to 5.5% in terms of area ratio in a GPC measurement, the epoxy resin has functions to exhibit a small change in volume after thermal history, be excellent in low thermal expansion and low moisture absorption, and be able to exhibit high heat resistance, in a cured product thereof. In particular, since the effects of reducing the thermal expansion coefficient, the moisture absorption, and the volume change after thermal history of a cured product are more enhanced, the content of the xanthene compound(s) (C) is preferably in the range of 0.5% to 5.0% in terms of area ratio in a GPC measurement, and more preferably in the range of 0.8% to 4.5%.

When the content of the xanthene compound(s) (C) in the epoxy resin is lower than 0.1%, since a large number of polar groups appear in a cured product and in addition, the interaction between the xanthene compound skeleton and the molecular skeleton is insufficient, a cured product therefrom has increased thermal expansion coefficient and increased moisture absorption, and exhibits a large change in volume after thermal history. In contrast, when the content exceeds 5.5%, since the density of crosslinks in a cured product therefrom decreases, the cured product has increased thermal expansion coefficient and significantly lowered heat resistance.

On the other hand, the content of the naphthol glycidyl ether compound (B) in the epoxy resin of the present invention is preferably in the range of 0.1% to 4.0% in terms of area ratio in a GPC measurement, and more preferably in the range of 0.5% to 3.5%, since a cured product that exhibits a small change in volume after thermal history, is excellent in low thermal expansion and low moisture absorption, and can exhibit high heat resistance can be obtained.

Since the epoxy resin of the present invention can provide a cured product that exhibits a small change in volume after thermal history and can exhibit high heat resistance and low moisture absorption, the total content of the glycidyl ether compound (B) and the xanthene compound(s) (C) is preferably from 1.0% to 8.0% in terms of area ratio in a GPC measurement, and more preferably in the range of 2.0% to 7.0%.

The epoxy equivalent of the epoxy resin of the present invention is preferably in the range of 220 g/eq to 275 g/eq, since a cured product that has high heat resistance and exhibits a small change in volume after thermal history can be obtained. More preferably, the epoxy equivalent is in the range of 220 g/eq to 270 g/eq.

Incidentally, the content in the present invention refers to a proportion of a peak area of each structure relative to the total peak area of the epoxy resin of the present invention, which is calculated through a GPC measurement according to the following conditions.

<GPC Measurement Conditions>

Measuring instrument: "HLC-8220 GPC" manufactured by Tosoh Corporation,

Column: guard column "HXL-L" manufactured by Tosoh Corporation

"TSK-GEL G2000HXL" manufactured by Tosoh Corporation

"TSK-GEL G2000HXL" manufactured by Tosoh Corporation

"TSK-GEL G3000HXL" manufactured by Tosoh Corporation

"TSK-GEL G4000HXL" manufactured by Tosoh Corporation

Detector: RI (refractive index detector)

Data processor: "GPC-8020, model II, version 4.10" manufactured by Tosoh Corporation Measurement Conditions:
Column temperature: 40° C.
Eluent: tetrahydrofuran
Flow rate: 1.0 ml/min
Standard: the following monodispersed polystyrene having a known molecular weight was used according to the measurement manual of the "GPC-8020, model II, version 4.10".

(Polystyrene Used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: obtained by filtering a 1.0 mass % solution in tetrahydrofuran in terms of the resin solid through a microfilter (50 μl).

A. Cresol-Naphthol Co-Condensed Novolac Type Epoxy Resin

As described above, the epoxy resin of the present invention includes a cresol-naphthol co-condensed novolac type epoxy resin (A) as an essential component. The cresol-naphthol co-condensed novolac type epoxy resin (A) is a compound in which a cresol glycidyl ether compound and a naphthol glycidyl ether compound are bound via a divalent methylene group. As an example of the cresol-naphthol co-condensed novolac type epoxy resin, a compound represented by the following structural formula (4) may be mentioned.

[Chem. 3]

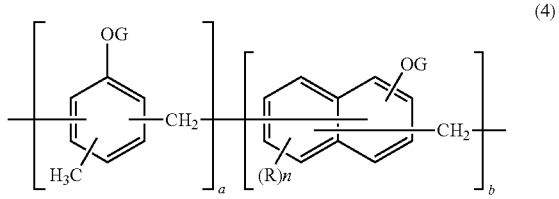

(4)

In the structural formula (4), G represents a glycidyl group, R each independently represents a hydrogen atom, a methyl group, an ethyl group, or an alkoxy group having 1 to 4 carbon atoms, a and b each independently represent a number of 1 to 20, and n represents an integer of 1 to 3.

Examples of an alkoxy group having 1 to 4 carbon atoms include a methoxy group, an ethoxy group, a propyloxy group, an isopropyloxy group, a t-propyloxy group, a butoxy group, an isobutyloxy group, and a t-butyloxy group.

Among the compounds represented by the structural formula (4), a compound in which R is a hydrogen atom is preferred from the viewpoint that a cured product of an obtained epoxy resin has both high heat resistance and low thermal expansion coefficient and can exhibit a property of showing a small change in volume after thermal history.

B. Glycidyl Ether Compound

As described above, the epoxy resin of the present invention also includes a naphthol glycidyl ether compound (B) as an essential component. As an example of the glycidyl ether compound (B), a compound represented, by the following structural formula (5) may be mentioned.

[Chem. 4]

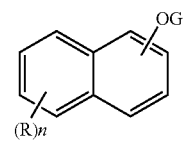

(5)

In the structural formula (5), G represents a glycidyl group, R each independently represents a hydrogen atom, a methyl group, an ethyl group, or an alkoxy group having 1 to 4 carbon atoms, and n represents an integer of 1 to 3.

Specific substituents on an alkoxy group having 1 to 4 carbon atoms are as described above.

Among the compounds represented by the structural formula (5), a compound in which R is a hydrogen atom is preferred in that the change in volume after thermal history in a cured product of the epoxy resin is smaller.

<Production Method of Epoxy Resin>

The epoxy resin of the present invention described in detail above can be produced by blending the cresol-naphthol co-condensed novolac type epoxy resin (A), the naphthol glycidyl ether compound (B), and the xanthene compound (C) so that the xanthene compound (C) is contained in a proportion of 0.1% to 5.5% in terms of area ratio of GPC. However, the epoxy resin is preferably produced according to the following method in points of excellent industrial productivity and excellent uniformity of the mixture.

The production method of the epoxy resin includes a step of subjecting a cresol, a naphthol compound, formaldehyde to a dehydration condensation reaction under normal pressure and inert gas atmosphere at a temperature in the range of 60 to 100° C. using an acid catalyst, and then applying a thermal history under normal pressure and inert gas atmosphere at a temperature in the range of 101 to 119° C. to obtain a phenol resin (Step 1), and a step of reacting the phenol resin obtained in the above step and an epihalohydrin (Step 2).

<Step 1>

As described above, in Step 1, a cresol, a naphthol compound, and formaldehyde are subjected to a dehydration condensation reaction under normal pressure and inert gas atmosphere at a temperature in the range of 60 to 100° C. using an acid catalyst, followed by a thermal history under normal pressure and inert gas atmosphere at a temperature in the range of 101 to 119° C. By reacting a cresol, a naphthol compound, and formaldehyde under the above conditions, a phenol resin containing as essential components, a cresol-naphthol co-condensed novolac type phenol, resin, a naphthol compound, and a xanthene compound can be obtained. Incidentally, normal pressure is a pressure at the time when the pressure is neither particularly reduced nor increased and generally refers to a pressure equal to the atmospheric pressure.

When describing in more detail, in Step 1, by using an acid catalyst, the xanthene compound (C) is produced, and furthermore, by performing a dehydration condensation reaction under normal pressure and inert gas atmosphere at a temperature in the range of 60 to 1000° C., followed by applying a thermal history under normal pressure and inert gas atmosphere at a temperature in the range of 101 to 119° C., at the end of Step 2, an epoxy resin containing the xanthene compound (C) in a proportion of 0.1% to 5.5% in terms of area ratio of GPC can be obtained.

Incidentally, when an alkali catalyst is used in the reaction, the xanthene compound (C) cannot be obtained at the end of Step 2. In addition, when the reaction is conducted under reduced pressure or under oxidizing atmosphere, the xanthene compound (C) is produced in an amount exceeding the aforementioned prescribed amount at the end of Step 2.

Moreover, even if the reaction is conducted under normal pressure and inert gas atmosphere, when the dehydration condensation reaction is conducted at a temperature lower than the prescribed temperature range, cresol does not react sufficiently, or the xanthene compound (C) of an amount exceeding the aforementioned prescribed amount is produced at the end of Step 2. Similarly, even if the reaction is conducted under normal pressure and inert gas atmosphere, unless a thermal history in a temperature range of 101 to 119° C. is applied, the xanthene compound (C) in the above range is not produced at the end of Step 2.

On the other words, unless a cresol, a naphthol compound, and formaldehyde are reacted under the above conditions, it is impossible to produce an epoxy resin which exhibits a small change in volume after thermal history, is excellent in low thermal expansion and low moisture absorption, and can, exhibit high heat resistance, in terms of an obtained cured product therefrom, (in Step 2).

Incidentally, the thermal history is preferably applied under normal pressure and inert gas atmosphere for 1 minute to 12 hours so that the temperature of the system becomes 101 to 119° C.

Examples of the acid catalyst used here include an inorganic acid such as hydrochloric acid, sulfuric acid, and phosphoric acid; an organic acid such as methanesulfonic acid, p-toluenesulfonic acid, and oxalic acid; and a Lewis acid such as boron trifluoride, anhydrous aluminum chloride, and zinc chloride as an acid catalyst. The use amount is preferably in the range of 0.001 to 2.0 times on a mole basis relative to the total number of phenolic hydroxy group in cresol and the naphthol compound which are raw material components.

The inert gas used here is not limited as long as it is a gas inert to the aforementioned chemical reactions and compounds, but nitrogen and argon are preferably used from the viewpoint of the production cost.

Examples of the organic solvent used for the reaction include methyl cellosolve, isopropyl alcohol, ethyl cellosolve, toluene, xylene, and methyl isobutyl ketone. The use amount of the organic solvent in the present invention is preferably in the range of 10 to 300 parts by mass based on 100 parts by mass of the total mass of cresol and the naphthol compound which are raw material components in that the obtained resin has a low viscosity.

1. Cresol

In the production method of the epoxy resin, a cresol, a naphthol compound, and formaldehyde are used as raw material components as described above. As cresol for use in the production method, o-cresol, m-cresol, and p-cresol are exemplified. Incidentally, among the above, o-cresol and p-cresol are preferred in that the molecular weight can be easily controlled.

2. Naphthol Compound

As the naphthol compound for use in the production method, α-naphthol, β-naphthol, or a compound in which an alkyl group such as a methyl group, an ethyl group, a propyl group, and a t-butyl group, or an alkoxy group such as a methoxy group and an ethoxy group is substituted on the nucleus of α-naphthol or β-naphthol are exemplified. Incidentally, among the above compounds, α-naphthol and β-naphthol are preferred from the viewpoint that a cured product of the obtained epoxy resin has both high heat resistance and low thermal expansion coefficient and exhibits the property of showing a low change in volume after thermal history.

3. Formaldehyde

In addition, formaldehyde for use in the production method may be a formalin solution in a form of aqueous solution or paraformaldehyde in a form of solid.

The ratio of cresol and the naphthol compound used in Step 1 are preferably in the range of 0.1 to 2.0 in the molar ratio (cresol/naphthol compound) in that the ratio of the components in the epoxy resin finally obtained can be easily controlled.

The ratio of formaldehyde charged is preferably from 0.6 to 2.0 times in a mole basis relative to the total molar number of cresol and the naphthol compound, and in point of excellent low thermal expansion, particularly preferably from 0.6 to 1.5 times.

Incidentally, after the completion of the reaction, it is preferred that a neutralization or water washing treatment is performed until the pH value of the reaction mixture becomes from 4 to 7. The neutralization treatment or water washing treatment may be performed according to an ordinary method, and, for example, a basic substance such as sodium hydroxide and potassium hydroxide can be used as a neutralizing agent. After the neutralization or water washing treatment, the organic solvent are distilled under heat and reduced pressure, whereby a phenol resin which provides an epoxy resin including the cresol-naphthol co-condensed novolac type phenol resin, the naphthol compound, and the xanthene compound, the xanthene compound (C) being contained in the aforementioned prescribed amount at the end of Step 2, is produced.

<Step 2>

In Step 2, a method is exemplified in which 1 to 10 mol of an epihalohydrin is added relative to 1 mol of the cresol-naphthol co-condensed novolac type phenol resin obtained in Step 1, 0.9 to 2.0 mol of a basic catalyst relative to 1 mol of the cresol-naphthol co-condensed novolac type phenol resin is further added at a time or gradually, and thus, a reaction is conducted at a temperature of 20 to 120° C. for 0.5 to 10 hours. The basic catalyst may be used in a form of solid or aqueous solution, and in the case of using an aqueous solution, a method may be used in which while continuously adding the aqueous solution, water and the epihalohydrin, etc. are continuously distilled from the reaction mixture under reduced pressure or normal pressure, and separation is further performed to remove water and continuously return the epihalohydrin, etc. to the reaction mixture.

In the case of industrial production, the epihalohydrin, etc. used for charging in the first batch of an epoxy resin production are new materials, but in the next and later batches, the epihalohydrin, etc. recovered from the crude reaction product are preferably used together with a new epihalohydrin, etc. in an amount corresponding to the amount that is consumed and lost in the reaction. In this case, impurities derived from reactions of epichlorohydrin and water, an organic solvent, etc., such as glycidol may be contained. In this case, the epihalohydrin used is not particularly limited, but examples thereof include epichlorohydrin, epibromohydrin, and β-methylepichlorohydrin. Among them, epichlorohydrin is preferred because of industrial availability.

Specific examples of the basic catalyst include an alkali earth metal hydroxide, an alkali metal carbonate, and an alkali metal hydroxide. An alkali metal hydroxide is particularly preferred in point of excellent catalytic activity in the epoxy resin synthesis reaction, and examples thereof include sodium hydroxide and potassium hydroxide. In use, the basic catalyst may be used in a form of aqueous solution of approximately from 10% by mass to 55% by mass, or may be used in a form of solid. In addition, by using an organic solvent together, the reaction rate in the synthesis of the epoxy resin can be increased. The organic solvent is not particularly limited, and examples thereof include ketones such as acetone and methyl ethyl ketone, alcohols such as methanol, ethanol, 1-propyl alcohol, isopropyl alcohol, 1-butanol, sec-butanol, and tert-butanol, cellosolves such as methyl cellosolve and ethyl cellosolve, ethers such as tetrahydrofuran, 1,4-dioxane, 1,3-dioxane, and diethoxyethane, and aprotic polar solvents such as acetonitrile, dimethylsulfoxide, and dimethyl formamide. The organic solvents each may be used alone or two or more thereof may be appropriately used in combination for adjusting the polarity.

Subsequently, the reaction product of the epoxidation reaction described above is washed with water, and then, the unreacted epihalohydrin and the organic solvent used together are removed by distillation under heat and reduced pressure. For producing an epoxy resin containing a lower amount of hydrolyzable halogen, it is possible that the obtained epoxy resin is dissolved again in an organic solvent such as toluene, methyl isobutyl ketone, and methyl ethyl ketone, and then an aqueous solution of an alkali metal hydroxide such as sodium hydroxide and potassium hydroxide is added to perform a further reaction. In this case, for the purpose of enhancing the reaction rate, a phase transfer catalyst such as a quaternary ammonium salt and a crown ether may be allowed to exist. In the case of using a phase transfer catalyst, the use amount is preferably in the range of 0.1% by mass to 3.0% by mass based on the epoxy resin. After the completion of the reaction, the produced salt is removed by filtration, water washing, or the like, and further the solvent such as toluene and methyl isobutyl ketone is removed by distillation under heat and reduced pressure, whereby a high purity epoxy resin can be obtained.

<Curable Resin Composition>

The epoxy resin of the present invention which includes as essential components the cresol-naphthol co-condensed novolac type epoxy resin (A), the naphthol glycidyl ether compound (B), and the one or more xanthene compound(s) (C) selected from the group of compounds represented by the structural formulae (1) to (3) can be used in combination with a curing agent. By incorporating a curing agent into the epoxy resin, a curable resin composition can be produced.

Examples of the curing agent that can be used here include known curing agents such as an amine compound, an amide compound, an acid anhydride compound, and a phenolic compound.

Specific examples of the amine compound include diaminodiphenylmethane, diethylenetriamine, triethylenetetramine, diaminodiphenylsulfone, isophoronediamine, imidazole, a $BF_3$-amine complex, and a guanidine derivative. Examples of the amide compound include dicyandiamide and a polyamide resin synthesized from linolenic acid dimer and ethylenediamine. Examples of the acid anhydride compound include phthalic anhydride, trimellitic anhydride, pyromellitic anhydride, maleic anhydride, tetrahydrophthalic anhydride, methyl tetrahydrophthalic anhydride, methylnadic anhydride, hexahydrophthalic anhydride, and methylhexahydrophthalic anhydride. Examples of the phenolic compound include a phenol novolac resin, a cresol novolac resin, an aromatic hydrocarbon formaldehyde resin-modified phenol resin, a dicyclopentadiene phenol addition type resin, a phenol aralkyl resin (Xylok resin), a naphthol aralkyl resin, a triphenylolmethane resin, a tetraphenylolethane resin, a naphthol novolac resin, a naphthol-phenol co-condensed novolac resin, a naphthol-cresol co-condensed novolac resin, and polyhydric phenolic hydroxy-containing compounds, such as a biphenyl-modified phenol resin (a polyhydric phenolic hydroxy group-containing compound in which phenol nuclei are linked via a bismethylene group), a biphenyl-modified naphthol resin (a polyhydric naphthol compound in which phenol nuclei are linked via a bismethylene group), an aminotriazine-modified phenol resin (a polyhydric phenolic hydroxy group-containing compound in which phenol nuclei are linked via melamine, benzoguanamine, etc.), and an alkoxy group-containing aromatic ring-modified novolac resin (a polyhydric phenolic hydroxy group-containing compound in which a phenol nucleus and an alkoxy group-containing aromatic ring are linked via formaldehyde)

In the curable resin composition, another thermosetting resin may be used together in addition to the epoxy resin described in detail, above.

Examples of the other thermosetting resin include a cyanate ester resin, a resin having a benzoxazine structure, a maleimide compound, an active ester resin, a vinylbenzyl compound, an acryl compound, and a copolymer of styrene and maleic anhydride. When the other thermosetting resin as above is used together, the use amount is not limited as long as the effects of the present invention are not impaired, but preferably the amount is in the range of 1 to 50 parts by mass in 100 parts by mass of the thermosetting resin composition.

Examples of the cyanate ester resin include a bisphenol A type cyanate ester resin, a bisphenol F type cyanate ester resin, a bisphenol E type cyanate ester resin, a bisphenol S type cyanate ester resin, a bisphenol sulfide type cyanate ester resin, a phenylene ether type cyanate ester resin, a naphthylene ether type cyanate ester resin, a biphenyl type cyanate ester resin, a tetramethylbiphenyl type cyanate ester resin, a polyhyroxynaphthalene type cyanate ester resin, a phenol novolac type cyanate ester resin, a cresol novolac type cyanate ester resin, a triphenylmethane type cyanate ester resin, a tetraphenylethane type cyanate ester resin, a dicyclopentadiene-phenol addition reaction type cyanate ester resin, a phenol aralkyl type cyanate ester resin, a naphthol novolac type cyanate ester resin, a naphthol aralkyl type cyanate ester resin, a naphthol-phenol co-condensed novolac type cyanate ester resin, a naphthol-cresol co-condensed novolac type cyanate ester resin, an aromatic hydrocarbon formaldehyde resin-modified phenol resin type cyanate ester resin, a biphenyl-modified novolac type cyanate ester resin, and an anthracene type cyanate ester resin. The compounds each may be used alone or two or more thereof may be used in combination.

Among the cyanate ester resins, in point that a cured product that is excellent particularly in the heat resistance can be obtained, a bisphenol A type cyanate ester resin, a bisphenol F type cyanate ester resin, a bisphenol E type cyanate ester resin, a polyhydroxynaphthalene type cyanate ester resin, a naphthylene ether type cyanate ester resin, and a novolac type cyanate ester resin are preferably used, and in point that a cured product that is excellent in dielectric characteristic can be obtained, a dicyclopentadiene-phenol addition reaction type cyanate ester resin is preferred.

The resin having a benzoxazine structure is not particularly limited, but examples thereof include a reaction product of bisphenol F, formalin, and aniline (an F-a type benzoxazine resin), a reaction product of diaminodiphenylmethane, formalin, and phenol (a P-d type benzoxazine resin), a reaction product of bisphenol A, formalin, and aniline, a reaction product of dihydroxydiphenyl ether, formalin, and aniline, a reaction product of diaminodiphenyl ether, formalin, and phenol, a reaction product of a dicyclopentadiene-phenol addition type resin, formalin, and aniline, a reaction product of phenolphthalein, formalin, and aniline, and a reaction product of diphenylsulfide, formalin, and aniline. The compounds each may be used alone or two or more thereof may be used in combination.

Examples of the maleimide compound include compounds represented by the following structural formulae (i) to (iii)

[Chem. 5]

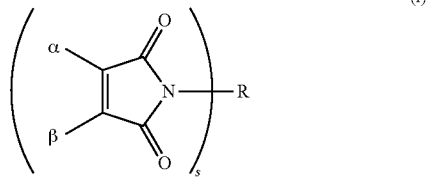

(i)

In the formula, R is an m-valent organic group, α and β each represent any of a hydrogen atom, a halogen atom, an alkyl group, and an aryl group, and s is an integer of 1 or more.

[Chem. 6]

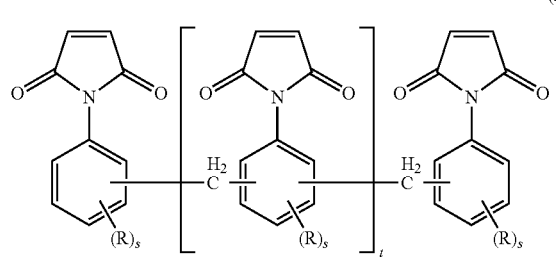

(ii)

In the formula, R is any of a hydrogen atom, an alkyl group, an aryl group, an aralkyl group, a halogen atom, a hydroxy group, and an alkoxy group, s is an integer of 1 to 3, and t is the average number of the repeating units and represents 0 to 10.

[Chem. 7]

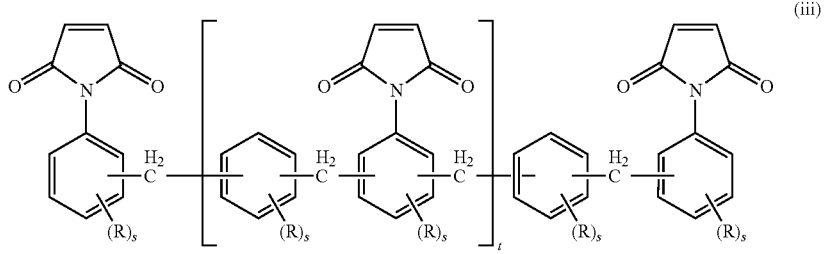

(iii)

In the formula, R is any of a hydrogen atom, an alkyl group, an aryl group, an aralkyl group, a halogen atom, a hydroxy group, and an alkoxy group, s is an integer of 1 to 3, and t is the average number of the repeating units and represents 0 to 10.

The compounds each may be used alone or two or more thereof may be used in combination.

The active ester resin is not particularly limited, but generally, compounds having, in a molecule, two or more ester groups having high reaction activity such as a phenol ester, a thiophenol ester, an N-hydroxyamine ester, an ester of a heterocyclic hydroxy compound are preferably used. The active ester resin is preferably one obtained by a condensation reaction of a carboxylic acid compound and/or a thiocarboxylic acid compound and a hydroxy compound and/or a thiol compound. In particular, from the viewpoint of enhancing heat resistance, an active ester resin obtained from a carboxylic acid compound or a halide thereof and a hydroxy compound is preferred, and an active ester resin obtained from a carboxylic acid compound, or a halide thereof and a phenol compound and/or a naphthol compound is more preferred. Examples of the carboxylic acid compound include benzoic acid, acetic acid, succinic acid, maleic acid, itaconic acid, phthalic acid, isophthalic acid, terephthalic acid, and pyromellitic acid, or a halide thereof. Examples of the phenol compound or a naphthol compound include hydroquinone, resorcin, bisphenol A, bisphenol F, bisphenol S, dihydroxydiphenyl ether, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, and dicyclopentadiene-phenol addition type resin.

As the active ester resin, specifically, an active ester type resin containing a dicyclopentadiene-phenol addition structure, an active ester resin containing a naphthalene structure, an active ester resin which is an acetylated compound of phenol novolac, an active ester resin which is a benzoylated product of phenol novolac, and the like are preferred, and among them, an active ester resin containing a dicyclopentadiene-phenol addition structure and an active ester resin containing a naphthalene structure are more preferred in point of excellent enhancement of pealing strength. Specific examples of the active ester resin containing a dicyclopentadiene-phenol addition structure include a compound represented by the following general formula (iv).

[Chem. 8]

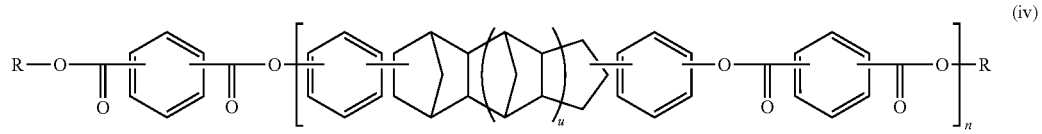

(iv)

In the formula (iv), R is a phenyl group or a naphthyl group, u represents 0 or 1, n is the average number of the repeating units and represents 0.05 to 2.5. Incidentally, from the view point of lowering dielectric loss tangent and increasing heat resistance of a cured product of the resin composition, R is preferably a naphthyl group, u is preferably 0, and n is preferably 0.25 to 1.5.

In the curable resin composition of the present invention, although the curing proceeds by the curable resin composition alone, a curing accelerator may be used together. Examples of the curing accelerator include a tertiary amine compound such as imidazole and dimethylaminopyridine; a phosphorus-based compound such as triphenylphosphine; boron trifluoride and a boron trifluoride amine complex such as boron trifluoride monoethylamine complex; an organic acid compound such as thiodipropionic acid; a benzoxazine compound such as thiodiphenol benzoxazine, and sulfonyl benzoxazine; and a sulfonyl compound. The compounds each may be used alone or two or more thereof may be used in combination. The amount of the catalyst added is preferably in the range of 0.001 to 15 parts by mass in 100 parts by mass of the curable resin composition.

When the curable resin composition of the present invention is used in an application requiring high flame retardancy, a halogen-free type flame retardant containing substantially no halogen atom may be incorporated.

Examples of the halogen-free type flame retardant include a phosphorus-based flame retardant, a nitrogen-based flame retardant, a silicone-based flame retardant, an inorganic flame retardant, and an organic metal salt-based flame retardant. The use thereof is by no means limited, and the flame retardants each may be used alone, plural flame retardants of the same type may be used, or flame retardants of different types may be used in combination.

The phosphorus-based flame retardant used may be an inorganic or organic compound. Examples of the inorganic compound include red phosphorus, ammonium phosphate compounds such as monoammonium phosphate, diammonium phosphate, triammonium phosphate, and ammonium polyphosphate, and an inorganic nitrogen-containing phosphorus compound such as phosphoric amide.

The red phosphorus is preferably previously subjected to a surface treatment for the purpose of preventing hydrolysis and the like, and examples of the method for surface treatment include (i) a method of coating with an inorganic compound such as magnesium hydroxide, aluminum hydroxide, zinc hydroxide, titanium hydroxide, bismuth oxide, bismuth hydroxide, and bismuth nitrate, or a mixture thereof, (ii) a method of coating with a mixture of an inorganic compound such as magnesium hydroxide, aluminum hydroxide, zinc hydroxide, and titanium hydroxide, and a thermosetting resin such as a phenol resin, and (iii) a method of double coating with an inorganic compound such as magnesium hydroxide, aluminum hydroxide, zinc hydroxide, and titanium hydroxide, and over the inorganic compound, with a thermosetting resin such as a phenol resin.

Examples of the organic phosphorus-based compound include a general-purpose organic phosphorus-based compound, such as a phosphoric acid ester compound, a phosphonic acid compound, a phosphinic acid compound, a phosphine oxide compound, a phosphorane compound, and an organic nitrogen-containing phosphorus compound, as well as a cyclic organic phosphorus compound, such as 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide, and a derivative obtained by reacting the above compound with a compound such as an epoxy resin and a phenol resin.

The amount of the phosphorus-based flame retardant incorporated is appropriately selected depending on the kind of the phosphorus-based flame retardant, other components in the curable resin composition, and the desired degree of the flame retardancy. For example, in 100 parts by mass of the curable resin composition in which all of the halogen-free type flame retardant and other fillers, additives, and the like are blended, in the case of using red phosphorus as the halogen-free type flame retardant, red phosphorus is preferably incorporated in the range of 0.1 parts by mass to 2.0 parts by mass, and in the case of using an organic phosphoric compound, the organic phosphoric compound is preferably incorporated in the range of 0.1 L parts by mass to 10.0 parts by mass, and more preferably in the range of 0.5 parts by mass to 6.0 parts by mass.

In the case of using the phosphorus-based flame retardant, hydrotalcite, magnesium hydroxide, a boron compound, zirconium oxide, a black dye, calcium carbonate, zeolite, zinc molybdate, activated carbon, etc. may be used together with the phosphorus-based flame retardant.

Examples of the nitrogen-based flame retardant include a triazine compound, a cyanuric acid compound, an isocyanuric acid compound, and a phenothiazine, and a triazine compound, a cyanuric acid compound, and an isocyanuric acid compound are preferred.

Examples of the triazine compound include melamine, acetoguanamine, benzoguanamine, melon, melam, succinoguanamine, ethylenedimelamine, melamine polyphosphate, and triguanamine, as well as, for example, (1) an aminotriazine sulfate compound such as guanyl melamine sulfate, melem sulfate, and melam sulfate, (2) a co-condensed compound of a phenol compound such as phenol, cresol, xylenol, butylphenol, and nonylphenol, a mealmine compound such as melamine, benzoguanamine, acetoguanamine, and formguanamine, and formaldehyde, (3) a mixture of the co-condensed compound of the above (2) and a phenol resin, such as a phenol-formaldehyde condensed compound, and (4) a compound obtained by further modifying the above (2) or (3) with tung oil or an isomerized linseed oil.

Examples of the cyanuric acid compound include cyanuric acid and melamine cyanurate.

The amount of the nitrogen-based flame retardant incorporated is appropriately selected depending on the kind of the nitrogen-based flame retardant, other components of the curable resin composition, and the desired degree of the flame retardancy. For example, in 100 parts by mass of the curable resin composition in which all of the halogen-free type flame retardant and other fillers, additives, and the like are blended, the nitrogen-based flame retardant is preferably incorporated in the range of 0.05 to 10 parts by mass, and more preferably incorporated in the range of 0.1 parts by mass to 5 parts by mass.

In the case of using the nitrogen-based flame retardant, a metal hydroxide, a molybdenum compound, or the like may be used together.

The silicone-based flame retardant can be used without any particular limitation as long as it is an organic compound containing a silicon atom, and examples thereof include a silicone oil, a silicone rubber, and a silicone resin. The amount of the silicone-based flame retardant incorporated is appropriately selected depending on the kind of the silicone-based flame retardant, other components of the curable resin composition, and the desired degree of the flame retardancy. For example, in 100 parts by mass of the curable resin composition in which all of the halogen-free type flame retardant and other fillers, additives, and the like are blended, the silicone-based flame retardant is preferably incorporated in the range of 0.05 to 20 parts by mass. In the case of using the silicone-based flame retardant, a molybdenum compound, an alumina, or the like may be used together.

Examples of the inorganic flame retardant include a metal hydroxide, a metal oxide, a metal carbonate compound, a metal powder, a boron compound, and a low-melting glass.

Examples of the metal hydroxide include aluminum hydroxide, magnesium hydroxide, dolomite, hydrotalcite, calcium hydroxide, barium hydroxide, and zirconium hydroxide.

Examples of the metal oxide include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of the metal carbonate compound include zinc carbonate, magnesium carbonate, calcium carbonate, barium carbonate, basic magnesium carbonate, aluminum carbonate, iron carbonate, cobalt carbonate, and titanium carbonate.

Examples of the metal powder include aluminum, iron, titanium, manganese, zinc, molybdenum, cobalt, bismuth, chromium, nickel, copper, tungsten, and tin.

Examples of the boron compound include zinc borate, zinc metaborate, barium metaborate, boric acid, and borax.

Examples of the low-melting glass include Ceepree (Bokusui Brown), hydrated glass $SiO_2$—$MgO$—$H_2O$, and a $PbO$—$B_2O_3$-based, $ZnO$—$P_2O_5$—$MgO$-based, $P_2O_5$—$B_2O_3$—$PbO$—$MgO$-based, $P$—$Sn$—$O$—$F$-based, $PbO$—$V_2O_5$—$TeO_2$-based, $Al_2O_3$—$H_2O$-based, and lead borosilicate-based glass compound.

The amount of the inorganic flame retardant incorporated is appropriately selected depending on the kind of the inorganic flame retardant, other components of the curable resin composition, and the desired degree of the flame retardancy. For example, in 100 parts by mass of the curable resin composition in which all of the halogen-free type flame retardant and other fillers, additives, and the like are blended, the inorganic flame retardant is preferably incorporated in the range of 0.05 parts by mass to 20 parts by mass, and more preferably incorporated in the range of 0.5 parts by mass to 15 parts by mass.

Examples of the organic metal salt-based flame retardant include ferrocene, an acetylacetonate metal complex, an organic metal carbonyl compound, an organic cobalt salt compound, an organic sulfonic acid metal salt, and a compound in which a metal atom and an aromatic compound or a heterocyclic compound are connected via an ionic bond or a coordinate bond.

The amount of the organic metal salt-based flame retardant incorporated is appropriately selected depending on the kind of the organic metal salt-based flame retardant, other components of the curable resin composition, and the desired degree of the flame retardancy. For example, with respect to 100 parts by mass of the curable resin composition, for example, the curable resin composition, in which all of the halogen-free type flame retardant and other fillers, additives, and the like are blended, the organic metal salt-based flame retardant is preferably incorporated in the range of 0.005 parts by mass to 10 parts by mass.

In the curable resin composition of the present invention, an inorganic filler may be incorporated as required. Examples of the inorganic filler include a fused silica, a crystal silica, an alumina, silicon nitride, and aluminum hydroxide. When the inorganic filler is incorporated in an especially large amount, a fused silica is preferably used. The fused silica may be used in any shape of flake and sphere, but for increasing the amount of the fused silica incorporated and suppressing increase of the melt viscosity of the molding material, it is preferred that the fused silica in a sphere shape is mainly used. For further increasing the amount of the spherical silica incorporated, it is preferred that the particle size distribution of the spherical silica is appropriately adjusted. The filling rate thereof is preferably higher in view of the flame retardancy, and the filling rate is particularly preferably 20% by mass or more based on the total mass of the curable resin composition. In addition, when the curable resin composition is used for such an application as a conductive paste, a conductive filler such as silver powder and copper powder can be used.

In the curable resin composition of the present invention, in addition to the above, various compounding agents such as a silane coupling agent, a mold release agent, a pigment, and an emulsifier can be added, as required.

<Application of Curable Resin Composition>

The curable resin composition of the invention can be applied in a semiconductor encapsulating material, a semiconductor device, a prepreg, a printed circuit board, a buildup substrate, a buildup film, a fiber-reinforced composite material, a fiber-reinforced resin molded article, a conductive paste, and the like, since a cured product obtained therefrom is excellent in low thermal expansion and low moisture absorption and can exhibit high heat resistance.

1. Semiconductor Encapsulating Material

As a method for obtaining a semiconductor encapsulating material from the curable resin composition of the present invention, a method in which the curable resin composition, the curing accelerator, and a compounding agent such as an inorganic filler are melt-mixed sufficiently into a uniform mixture using, according to the need, an extruder, a kneader, or a roll, may be exemplified. In this case, a fused silica is generally used as the inorganic filler, but in the case of use as a high thermal conductive semiconductor encapsulating agent for power transistor or for power IC, a crystal silica, an alumina, silicon nitride, and the like which have higher thermal conductivity than fused silica may be used in a high filling rate, or a fused silica, a crystalline silica, alumina, silicon nitride, and the like may be used. As for the filling rate, the inorganic filler is preferably used in the range of 30% by mass to 95% by mass based on 100 parts by mass of the curable resin composition, and in particular, for enhancing flame retardancy, moisture resistance, and solder clack resistance, and for lowering coefficient of linear expansion, the filling rate is preferably 70 parts by mass or more, and more preferably 80 parts by mass or more.

2. Semiconductor Device

As a method for obtaining a semiconductor device from the curable resin composition of the present invention, a method in which the semiconductor encapsulating material is molded using a cast, a transfer molding machine, an injection molding machine, or the like, and further heated at 50 to 200° C. for 2 to 10 hours, may be exemplified.

3. Prepreg

As a method for obtaining a prepreg from the curable resin composition of the present invention, a method in which an organic solvent is blended into the curable resin composition to prepare a varnish, and a reinforcing substrate (paper, glass fabric, glass nonwoven fabric, aramid paper, aramid fabric, glass mat, glass roving cloth, or the like) is impregnated with the varnish, and the impregnated substrate is heated at a heating temperature corresponding to the kind of the used solvent, preferably at 50 to 170° C., thereby obtaining a prepreg, may be exemplified. The mass ratio of the resin composition and the reinforcing substrate used in this case is not particularly limited, but generally, the ratio is preferably adjusted so that the resin content in the prepreg is 20% by mass to 60% by mass.

Examples of the organic solvent used here include methyl ethyl ketone, acetone, dimethylformamide, methyl isobutyl ketone, methoxy propanol, cyclohexane, methyl cellosolve, ethyldiglycol acetate, and propyleneglycol monomethyl ether acetate, and the selection and the suitable use amount may be appropriately selected depending on the application. For example, in the case where a printed circuit board is further produced from the prepreg as described below, a polar solvent having a boiling point of 160° C. or lower such as methyl ethyl ketone, acetone, and dimethylformamide is preferably used, and such a solvent is preferably used in a proportion of 40% by mass to 80% by mass in terms of the non-volatile matter.

4. Printed Circuit Board

As a method for obtaining a printed circuit board from the curable resin composition of the present invention, a method in which the prepreg is laminated by an ordinary method, a copper foil is laminated as needed, and the laminate is heated and pressed under a pressure of 1 to 10 MPa at 170 to 300° C. for 10 minutes to 3 hours, may be exemplified.

5. Buildup Substrate

As a method for obtaining a buildup substrate from the curable resin composition of the present invention, a method having steps 1 to 3 may be exemplified. In the step 1, firstly, the curable resin composition in which rubber, filler, and the like is appropriately incorporated is applied on a circuit board having a circuit formed thereon using a spray coating method, curtain coating method, and the like, and then the resultant is cured. In the step 2, the circuit board having the curable resin composition applied thereon is perforated, if desirable, to make prescribed through holes and the like, and is treated with a roughening agent, and the surface is washed with hot water, thereby forming unevenness on the substrate, followed by subjecting the surface to a plating treatment by a metal such as copper. In the step 3, the operations of the steps 1 to 2 are sequentially repeated according to the need, whereby resin insulating layers and conductor layers with a subscribed circuit pattern are alternately built up to form a buildup substrate. Incidentally, in the above steps, the perforation of the through holes is desirably performed after forming the outermost resin insulating layer. Alternatively, it is possible to produce the buildup substrate of the present invention by heating and pressing on a circuit board having a circuit formed thereon, a copper foil with resin in which the resin composition is semi-cured on a copper foil, at 170 to 300° C. to form a roughened surface, with the plating treatment being omitted.

6. Buildup Film

As a method for obtaining a buildup film from the curable resin composition of the present invention, for example, a method in which a curable resin composition is applied on a support film, and then the film is dried to form a resin composition layer on the support film. In the case where the curable resin composition of the present invention is used for a buildup film, it is important that the film is softened at a temperature condition of lamination in a vacuum lamination method (generally from 70° C. to 140° C.) to achieve a flowability (resin flow) that allows for the resin to fill in via holes or through holes which are present in the circuit board simultaneously with the lamination of the circuit board. The components are preferably blended so as to exhibit such characteristic.

Here, the through holes in the circuit board generally have a diameter of 0.1 to 0.5 mm and generally have a depth of 0.1 to 1.2 mm, and in general the resin is preferably allowed to fill in the holes in the above range. Incidentally, when both the surfaces of the circuit board are laminated, it is desired that about one-half of the through hole is filled.

As a specific method for producing the buildup film described, above, a method in which, after an organic solvent is blended into the curable resin composition to prepare a varnish, the composition is applied on a surface of a support film (Y), and further, the organic solvent is dried by heating, blowing with hot air or other method, to form a curable resin composition layer (X), may be exemplified.

As the organic solvent used here, for example, ketones such as acetone, methyl ethyl ketone, and cyclohexane, acetic acid esters such as ethyl acetic, butyl acetate, cellosolve acetate, propyleneglycol monomethyl ether acetate and carbitol acetate, cellosolve, carbitols such as butylcarbitol, aromatic hydrocarbons such as toluene and xylene, dimethylformamide, dimethylacetamide, N-methylpyrrolidone, etc. are preferably used, and the solvent is preferably used in a proportion of 30% by mass to 60% by mass in terms of the non-volatile matter.

Incidentally, the thickness of the resin composition layer (X) formed is generally required to be the thickness of the conductor layer or more. The thickness of the conductor layer included in the circuit board is generally in the range of 5 to 70 μm, and therefore the thickness of the resin composition layer is preferably 10 to 100 μm. Incidentally, the resin composition layer (X) in the present invention may be protected by a protection film described later. By protecting with a protection film, it is possible to prevent deposition of dust and scratches on the surface of the resin composition layer.

Examples of the support film and protection film include polyolefins such as polyethylene, polypropylene, and polyvinyl chloride, polyesters such as polyethylene terephthalate (hereinunder, sometimes abbreviated as "PET") and polyethylene naphthalate, polycarbonate, and polyimide, and further include a release paper and a metal foil such as copper foil and aluminum foil. Incidentally, the support film and protection film may be previously subjected to a mud treatment, a corona treatment, as well as a mold release treatment. The thickness of the support film is not particularly limited, but generally 10 to 150 μm, and preferably in the range of 25 to 50 μm. The thickness of the protection film is preferably 1 to 40 μm.

The support film (Y) is released after the support film is laminated on the circuit board, or after the insulating layer is formed by thermal curing. By releasing the support film (Y) after the curable resin composition layer which constitutes the buildup film is thermally cured, deposition of dust and the like in the curing step can be prevented. In the case of releasing after curing, in general, the support film is subjected to a mold release treatment in advance.

Incidentally, a multilayer printed circuit board can be produced from the buildup film obtained as above. For example, after releasing the protection film in the case where the resin composition layer (X) is protected by the protection film, the resin composition layer (X) is laminated on one or both surfaces of the circuit board in direct contact with the circuit board, for example, by a vacuum lamination method. The lamination method may be a batch process, or may be a continuous process by a roll. As required, the buildup film and the circuit board may be heated (preheated) before the lamination as required. As the condition of the lamination, the pressing temperature (lamination temperature) is preferably 70 to 140° C., the pressing pressure is preferably 1 to 11 kgf/cm$^2$ (9.8×104 to 107.9×104 N/m$^2$), and the lamination is preferably performed under a reduced air pressure of 20 mmHg (26.7 hPa) or lower.

7. Fiber-Reinforced Composite Material

As a method for obtaining a fiber-reinforced composite material (intermediate material of a sheet form in which a reinforcing fiber is impregnated with a resin) from the curable resin composition of the present, invention, a method in which components constituting a curable resin composition are uniformly mixed to prepare a varnish, then a reinforcing substrate formed of a reinforcing fiber is impregnated with the varnish, which is then subjected to a polymerization reaction, thereby producing the fiber-reinforced composite material, may be exemplified.

The specific curing temperature in the polymerization reaction is preferably in the temperature range of 50 to 250° C., and it is particularly preferred that curing at 50 to 100° C. is performed to produce a tack-free cured product, and is then further treated under a temperature condition of 120 to 200° C.

Here, the reinforcing fiber may be any of a twisted yarn, an untwisting yarn, a twistless yarn, and the like, but an untwisting yarn and a twistless yarn are preferred in point of providing a fiber-reinforced plastic member having both of moldability and mechanical strength. Moreover, the reinforcing fiber used may have a form in which fibers are aligned in one direction or a form of textile. In a textile, plain weave, satin weave, or the like may be selected appropriately depending on the part where the material is used and the use purpose. Specifically, because of excellent mechanical strength and durability, a carbon fiber, a glass fiber, an aramid fiber, a boron fiber, an alumina fiber, a silicon carbide fiber, etc. are exemplified, and two or more thereof may be used in combination. Among them, since strength of a molded article is excellent, a carbon fiber is preferred, and as such a carbon fiber, various types such as a polyacrylonitrile-based, a pitch-based, and a rayon-based carbon fibers may be used. Among others, a polyacrylonitrile-based one by which a carbon fiber having high strength can be obtained is preferred. Here, the amount of the reinforcing fiber used when the reinforcing substrate formed of the reinforcing fiber is impregnated with the varnish to prepare the fiber-reinforced composite material is preferably such an amount that the volume content of the reinforcing fiber in the fiber-reinforced composite material is in the range of 40% to 85%.

8. Fiber-Reinforced Resin Molded Article

As a method for obtaining a fiber-reinforced molded article (a molded article obtained by curing a sheet member in which a reinforcing fiber is impregnated with a resin) from the curable resin composition of the present invention, the following process may be exemplified. That is, a prepreg in which the reinforcing fiber is impregnated with the varnish is produced by: a hand lay-up method or a spray-up method in which a fiber aggregate is spread in a die, and multiple layers of the varnish are stacked; a vacuum bag method in which substrates formed of the reinforcing fiber are stacked while being impregnated with the varnish using any of a male die and a female die, and the resulting stack is molded, covered with a flexible die that can exert pressure to the molded article, and sealed air-tightly, and then molded in vacuum (under reduced pressure); an SMC press method in which the varnish previously containing the reinforcing fiber is formed into a sheet and the sheet is subjected to compression molding with a die; an RTM method in which the varnish is injected into a mating die in which the fibers are spread; or other methods, and the prepreg is baked and hardened in a large autoclave. Incidentally, the fiber-reinforced resin molded article obtained above is a molded article including the reinforcing fiber and a cured product of the curable resin composition, and specifically, the amount of the reinforcing fiber in the fiber-reinforced molded article is preferably in the range of 40% by mass to 70% by mass, and in point of the strength, the amount is particularly preferably in the range of 50% by mass to 70% by mass.

9. Conductive Paste

As a method for obtaining a conductive paste from the curable resin composition of the present invention, for example, a method in which fine conductive particles are dispersed in the curable resin composition may be exemplified. The conductive paste can be selected from a paste resin composition for circuit connection and an anisotropic conductive adhesive depending on the kind of the fine conductive particles used.

EXAMPLES

The present invention is specifically described below with reference to examples and comparative examples. As used hereinbelow, "parts" and "%" are based on the mass unless otherwise specified. Incidentally, GPC, $^{13}$CNMR, and FD-MS spectra were measured according to the following conditions.

<GPC Measurement Conditions>

Measurement by GPC was performed under the following conditions.

Measuring instrument: "HLC-8220 GPC" manufactured by Tosoh Corporation,

Column: guard column "HXL-L" manufactured by Tosoh Corporation

"TSK-GEL G2000HXL" manufactured by Tosoh Corporation

"TSK-GEL G2000HXL" manufactured by Tosoh Corporation

"TSK-GEL G3000HXL" manufactured by Tosoh Corporation
"TSK-GEL G4000HXL" manufactured by Tosoh Corporation
Detector: RI (refractive index detector)
Data processor: "GPC-8020, model II, version 4.10" manufactured by Tosoh Corporation
Measurement Conditions:
   Column temperature: 40° C.
   Eluent: tetrahydrofuran
   Flow rate: 1.0 ml/min
Standard: the following monodispersed polystyrene having a known molecular weight was used according to the measurement manual of the "GPC-8020, model II, version 4.10"
   (Polystyrene Used)
   "A-500" manufactured by Tosoh Corporation
   "A-1000" manufactured by Tosoh Corporation
   "A-2500" manufactured by Tosoh Corporation
   "A-5000" manufactured by Tosoh Corporation
   "F-1" manufactured by Tosoh Corporation
   "F-2" manufactured by Tosoh Corporation
   "F-4" manufactured by Tosoh Corporation
   "F-10" manufactured by Tosoh Corporation
   "F-20" manufactured by Tosoh Corporation
   "F-40" manufactured by Tosoh Corporation
   "F-80" manufactured by Tosoh Corporation
   "F-128" manufactured by Tosoh Corporation
   Sample: obtained by filtering a 1.0 mass % solution in tetrahydrofuran in terms of the resin solid through a microfilter (50 μl).
<13C-NMR Measurement Conditions>
   Instrument: AL-400, manufactured by JEOL Ltd.
   Measurement mode: SGNNE (NOE-eliminated 1H-complete decoupling)
   Solvent: dimethyl sulfoxide
   Pulse angle: 45° pulse,
   Sample concentration: 30 wt %
   Cumulative number: 1000
<FD-MS Spectrum Measurement Conditions>
   FD-MS spectrum was measured using Double focusing mass spectrometer "A-X505H (FD505H)" manufactured by JEOL Ltd.

[Synthetic Example 1] Synthesis of Phenol Resin

In a flask equipped with a thermometer, a dropping funnel, a condenser tube, a fractionating column, and a stirrer, 144 g (1.0 mol) of α-naphthol, 577 g (4.0 mol) of β-naphthol, 270 g (2.5 mol) of o-cresol, and 5 g of p-toluenesulfonic acid were charged while being purged with nitrogen gas, and the mixture was stirred while raising the temperature from room temperature to 70° C. over 45 minutes. Subsequently, 420 g (5.8 mol) of a 42 wt % formalin aqueous solution was added dropwise over 1 hour. After the completion of the dropwise addition, the temperature was raised to 110° C., and the reaction mixture was stirred under normal pressure for 2 hours, neutralized with a 49% sodium hydroxide aqueous solution, and washed with water to remove the salt. The temperature was then raised to 160° C. over 3 hours, and the solvent and water remaining in the reaction system were removed under heat and reduced pressure, whereby a phenol resin was obtained. The obtained phenol resin had a softening point of 113° C. (B&R method) and a hydroxy group equivalent of 165 g/eq. A GPC chart of the obtained phenol resin is shown in FIG. 1. From FIG. 1, the area ratio of naphthol monomer in the phenol resin in the GPC measurement was 3.4%, and the area ratio of the xanthene compound in the GPC measurement was 3.5%.

[Synthetic Example 2] Synthesis of Epoxy Resin (D-1)

Figure 2:
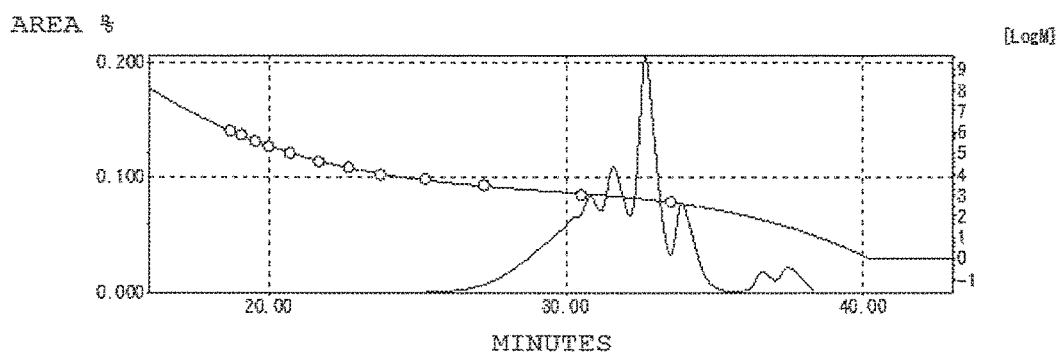
FIG. 2 shows a GPC chart of an epoxy resin obtained in Synthetic Example 2.
Figure 3:
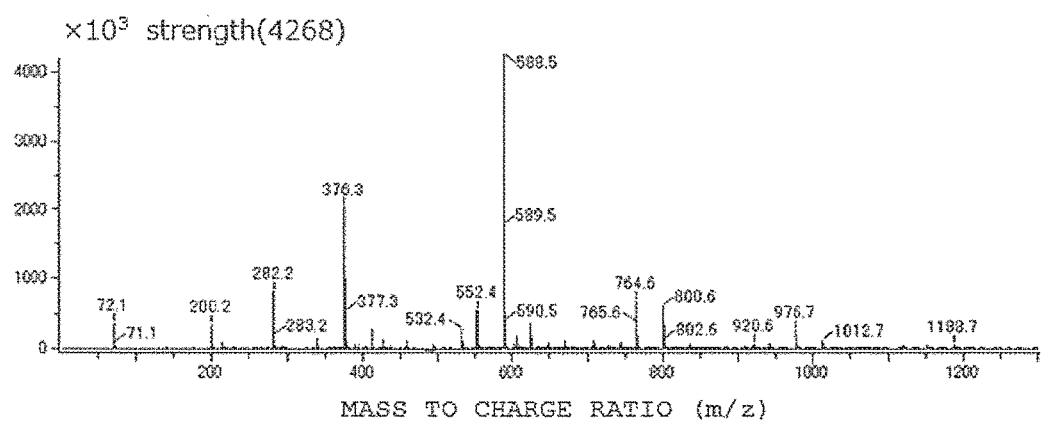
FIG. 3 shows an FD-MS spectrum of an epoxy resin obtained in Synthetic Example 2.
Figure 4:
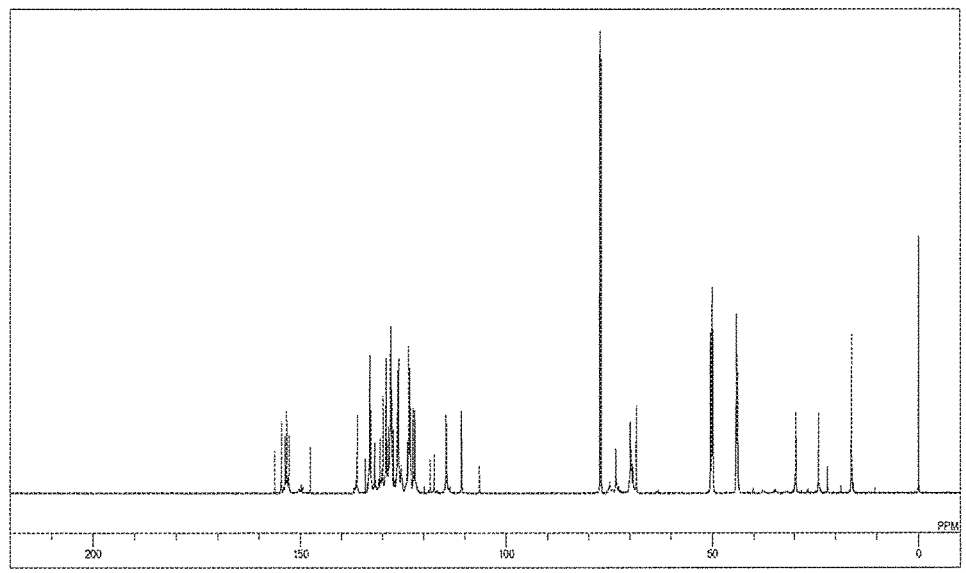
FIG. 4 shows a $^{13}$C-NMR spectrum of an epoxy resin obtained in Synthetic Example 2.

Next, in a flask equipped with a thermometer, a condenser tube, and a stirrer, while being purged with nitrogen gas, 165 g (a hydroxy group equivalent: 1.0 g/eq) of the phenol resin obtained in Synthetic Example 1, 555 g (6.0 mol) of epichlorohydrin, and 53 g of n-butanol were charged and dissolved. After the temperature was raised to 50° C., 220 g (1.10 mol) of a 20% sodium hydroxide aqueous solution was added over 3 hours, and the mixture was then reacted at 50° C. for 1 hour. After the completion of the reaction, unreacted epichlorohydrin was removed by distillation at 150° C. under reduced pressure. Next, 300 g of methyl isobutyl ketone and 50 g of n-butanol were added to the obtained crude epoxy resin to dissolve the epoxy resin. To this solution, 15 g of a 10 wt % sodium hydroxide aqueous solution was further added, the mixture was reacted at 830° C. for 2 hours, and then water washing with 100 g of water was repeated three times until the pH of the washing liquid became neutral. Next, the system was dehydrated by azeotropic distillation, and subjected to precise filtration, followed by removing the solvent by distillation under reduced pressure, whereby 210 g of an epoxy resin (D-1) containing the cresol-naphthol co-condensed novolac type epoxy resin (A), the naphthol glycidyl ether compound (B), and the xanthene compound (C) was obtained. A GPC chart of the obtained epoxy resin (D-1) is shown in FIG. 2, FD-MS spectrum is shown in FIG. 3, and $^{13}$C-NMR spectrum is shown in FIG. 4. Here, as is seen in the FD-MS spectrum of FIG. 3, since peaks of $M^+$=200 and 282 were observed, it was confirmed that the naphthol glycidyl ether compound (B) and the xanthene compound (C) were produced. In addition, it was confirmed in the GPC chart shown in FIG. 2 that the naphthol glycidyl ether compound (B) showed a peak at 36.6 minutes and the xanthene compound (C) showed a peak at 37.4 minutes. Here, it was confirmed in a GPC chart shown in FIG. 2 that the area ratio of the naphthol glycidyl ether compound (B) and the xanthene compound (C) in the epoxy resin (D-1) were 2.4% and 3.5%, respectively. Incidentally, the obtained epoxy resin had a softening point of 81° C. (B&R method) and an epoxy equivalent of 242 g/eq.

[Synthetic Example 3] Synthesis of Phenol Resin

Figure 5:
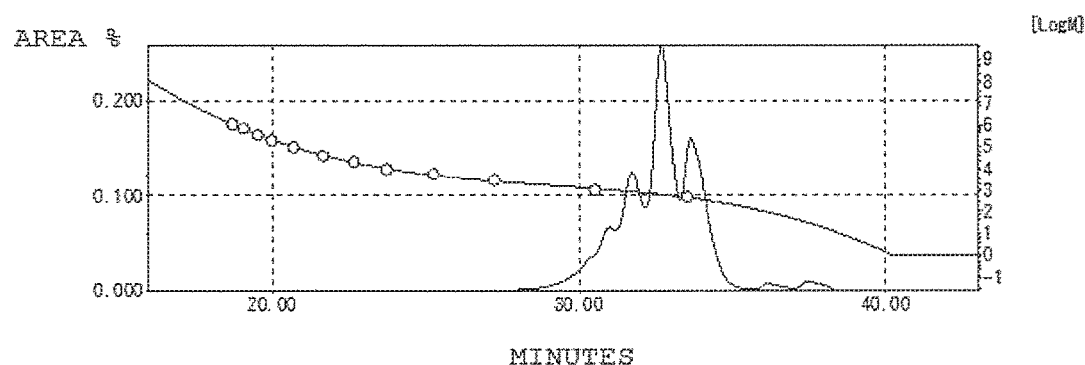
FIG. 5 shows a GPC chart of a phenol resin obtained in Synthetic Example 3.

A phenol resin was obtained in the same manner as in Synthetic Example 1, except that the amount of p-toluenesulfonic acid was changed from 5 g to 2 g. The obtained phenol resin had a softening point of 100° C. (B&R method) and a hydroxy group equivalent of 156 g/eq. A GPC chart of the obtained phenol resin is shown in FIG. 5. From FIG. 5, the area ratio of naphthol monomer in the phenol resin in the GPC measurement was 1.1%, and the area ratio of the xanthene compound in the GPC measurement was 1.6%.

[Synthetic Example 4] Synthesis of Epoxy Resin (D-2)

An epoxy resin (D-2) was obtained in the same manner as in Synthetic Example 2 except that, in place of 165 g of the phenol resin of Synthetic Example 1, 156 g of the phenol resin obtained in Synthetic Example 3 was used. The obtained epoxy resin (D-2) had a softening point of 74° C.

Figure 6:
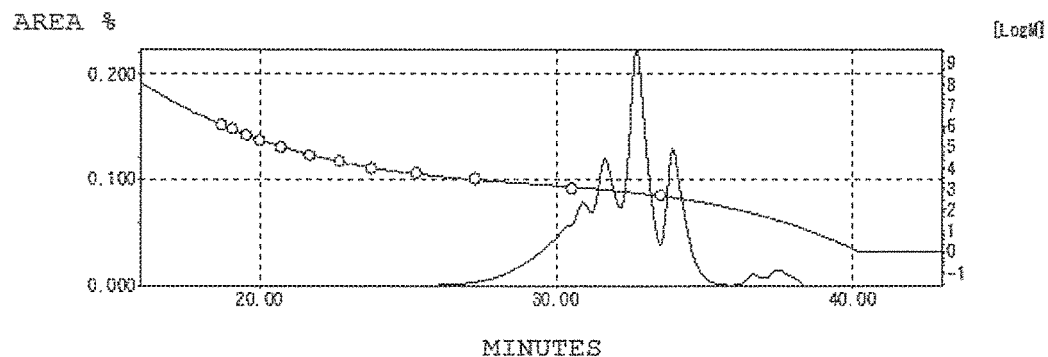
FIG. 6 shows a GPC chart of an epoxy resin obtained in Synthetic Example 4.

(B&R method) and an epoxy equivalent of 230 g/eq. A GPC chart of the obtained epoxy resin (D-2) is shown in FIG. 6. From FIG. 6, the area ratio of the naphthol glycidyl ether compound (B) in the epoxy resin (D-2) in the GPC measurement was 0.9%, and the area ratio of the xanthene compound (C) in the GPC measurement was 1.5%.

[Synthetic Example 5] Synthesis of Phenol Resin

Figure 7:
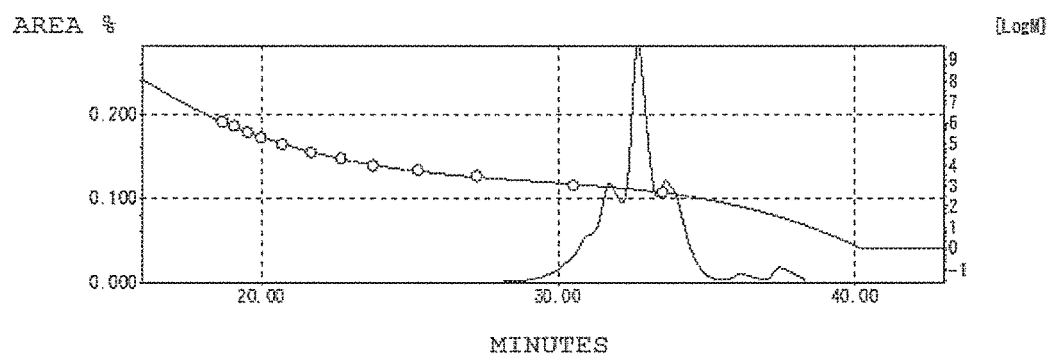
FIG. 7 shows a GPC chart of a phenol resin obtained in Synthetic Example 5.

A phenol resin was obtained in the same manner as in Synthetic Example 1, except that the amount of o-cresol was changed from 270 g (2.5 mol) to 216 g (2.0 mol). The obtained phenol resin had a softening point of 107° C. (B&R method) and a hydroxy group equivalent of 160 g/eq. A GPC chart of the obtained phenol resin is shown in FIG. 7. From FIG. 7, the area ratio of naphthol monomer in the phenol resin in the GPC measurement was 1.8%, and the area ratio of the xanthene compound in the GPC measurement was 3.1%.

[Synthetic Example 6] Synthesis of Epoxy Resin (D-3)

Figure 8:
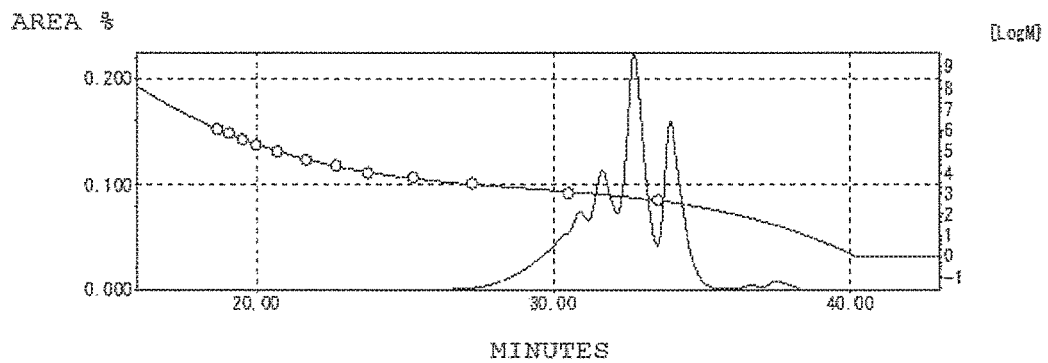
FIG. 8 shows a GPC chart of an epoxy resin obtained in Synthetic Example 6.

An epoxy resin (D-3) was obtained in the same manner as in Synthetic Example 2 except that, in place of 165 g of the phenol resin of Synthetic Example 1, 160 g of the phenol resin obtained in Synthetic Example 5 was used. The obtained epoxy resin (D-3) had a softening point of 80° C. (B&R method) and an epoxy equivalent of 236 g/eq. A GPC chart of the obtained epoxy resin (D-3) is shown in FIG. 8. From FIG. 8, the area ratio of the naphthol glycidyl ether compound (B) in the epoxy resin (D-3) in the GPC measurement was 1.8%, and the area ratio of the xanthene compound (C) in the GPC measurement was 2.5%.

[Synthetic Example 7] Synthesis of Phenol Resin

Figure 9:
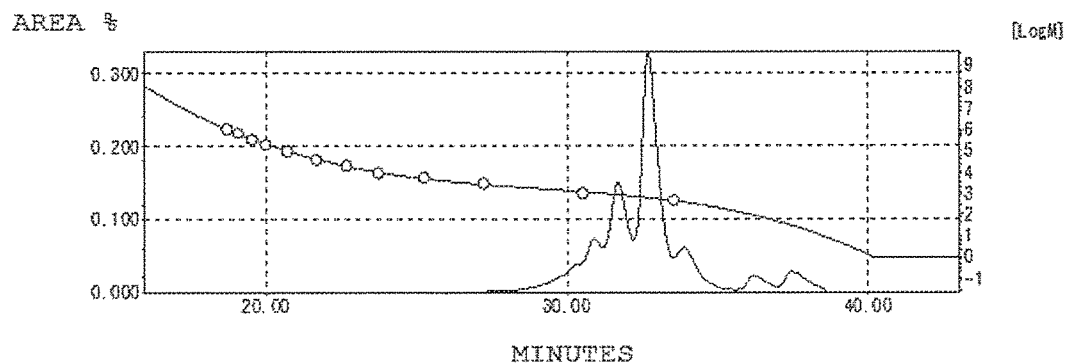
FIG. 9 shows a GPC chart of a phenol resin obtained in Synthetic Example 7.

A phenol resin was obtained in the same manner as in Synthetic Example 1, except that the amount of α-naphthol was changed from 144 g (1.0 mol) to 0 g, and the amount of o-cresol was changed from 270 g (2.5 mol) to 216 g (2.0 mol). The obtained phenol resin had a softening point of 110° C. (B&R method) and a hydroxy group equivalent of 169 g/eq. A GPC chart of the obtained phenol resin is shown in FIG. 9. From FIG. 9, the area ratio of naphthol monomer in the phenol resin in the GPC measurement was 3.5%, and the area ratio of the xanthene compound in the GPC measurement was 5.0%.

[Synthetic Example 8] Synthesis of Epoxy Resin (D-4)

Figure 10:
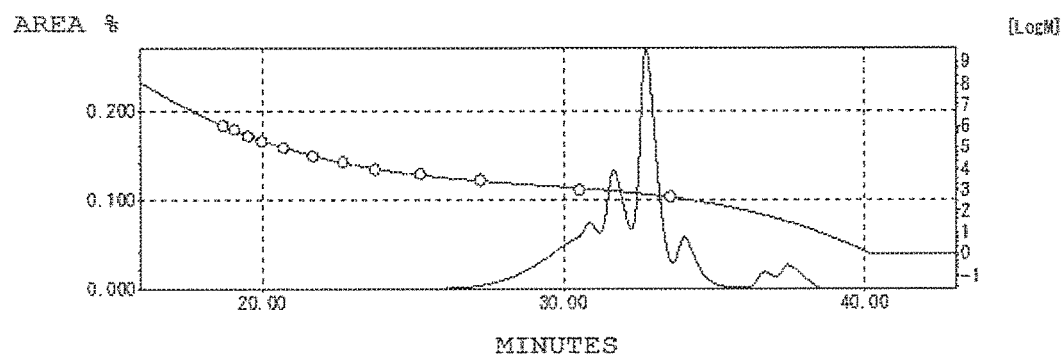
FIG. 10 shows a GPC chart of an epoxy resin obtained in Synthetic Example 8.

An epoxy resin (D-4) was obtained in the same manner as in Synthetic Example 2, except that, in place of 165 g of the phenol resin of Synthetic Example 1, 169 g of the phenol resin obtained in Synthetic Example 7 was used. The obtained epoxy resin (D-4) had a softening point of 82° C. (B&R method) and an epoxy equivalent of 248 g/eq. A GPC chart of the obtained epoxy resin (D-4) is shown in FIG. 10. From FIG. 10, the area ratio of the naphthol glycidyl ether compound (B) in the epoxy resin (D-4) in the GPC measurement was 2.2%, and the area ratio of the xanthene compound (C) in the GPC measurement was 4.4%.

[Synthetic Example 9] Synthesis of Phenol Resin

Figure 11:
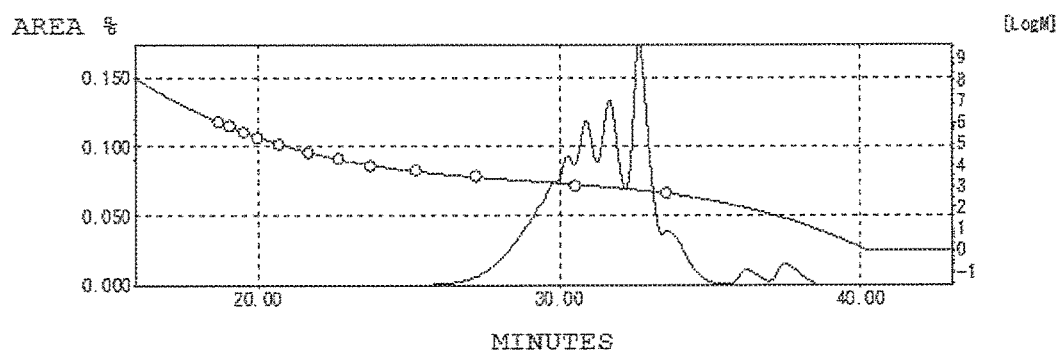
FIG. 11 shows a GPC chart of a phenol resin obtained in Synthetic Example 9.

A phenol resin was obtained in the same manner as in Synthetic Example 1, except that the amount of o-cresol was changed from 270 g (2.5 mol) to 324 g (3.0 mol). The obtained phenol resin had a, softening point of 122° C. (B&R method) and a hydroxy group equivalent of 155 g/eq. A GPC chart of the obtained phenol resin is shown in FIG. 11. From FIG. 11, the area ratio of naphthol monomer in the phenol resin in the GPC measurement was 1.6%, and the area ratio of the xanthene compound in the GPC measurement was 2.5%.

[Synthetic Example 10] Synthesis of Epoxy Resin (D-5)

Figure 12:
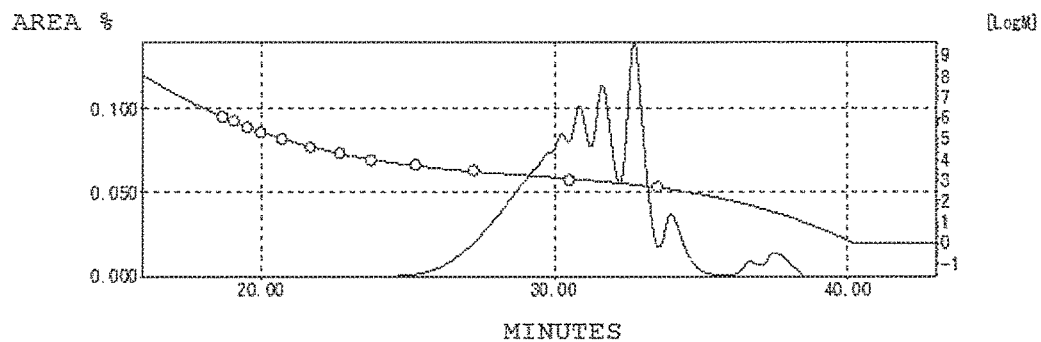
FIG. 12 shows a GPC chart of an epoxy resin obtained in Synthetic Example 10.

An epoxy resin (D-5) was obtained in the same manner as in Synthetic Example 2, except that, in place of 165 g of the phenol resin of Synthetic Example 1, 155 g of the phenol resin obtained in Synthetic Example 9 was used. The obtained epoxy resin (D-5) had a softening point of 93° C. (B&R method) and an epoxy equivalent of 234 g/eq. A GPC chart of the obtained epoxy resin (D-5) is shown in FIG. 12. From FIG. 12, the area ratio of the naphthol glycidyl ether compound (B) in the epoxy resin (D-5) in the GPC measurement was 1.1%, and the area ratio of the xanthene compound (C) in the GPC measurement was 2.5%.

[Synthetic Example 11] Synthesis of Phenol Resin

Figure 13:
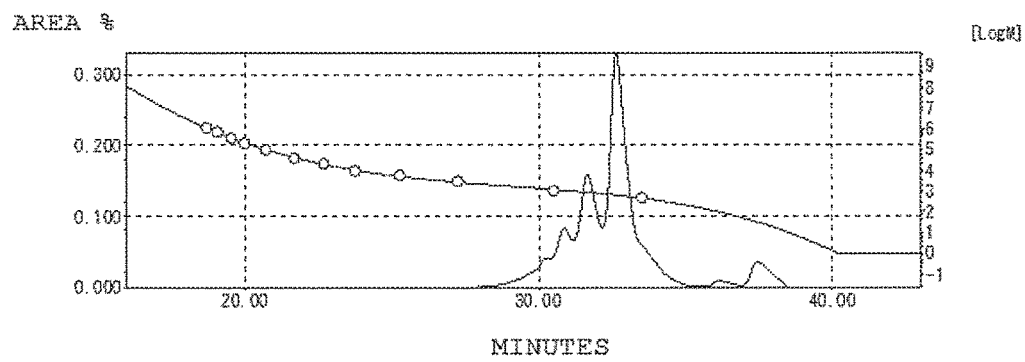
FIG. 13 shows a GPC chart of a phenol resin obtained in Synthetic Example 11.

A phenol resin was obtained in the same manner as in Synthetic Example 1, except that the amount of α-naphthol was changed from 144 g (1.0 mol) to 0 g (0 mol) and the amount of o-cresol was changed to 281 g (2.6 mol). The obtained phenol resin had a softening point of 110° C. (B&R method) and a hydroxy group equivalent of 158 g/eq. A GPC chart of the obtained phenol resin (A-6) is shown in FIG. 13. From FIG. 13, the area ratio of naphthol monomer in the phenol resin in the GPC measurement was 1.2%, and the area ratio of the xanthene compound in the GPC measurement was 5.6%.

[Synthetic Example 12] Synthesis of Epoxy Resin (D-6)

Figure 14:
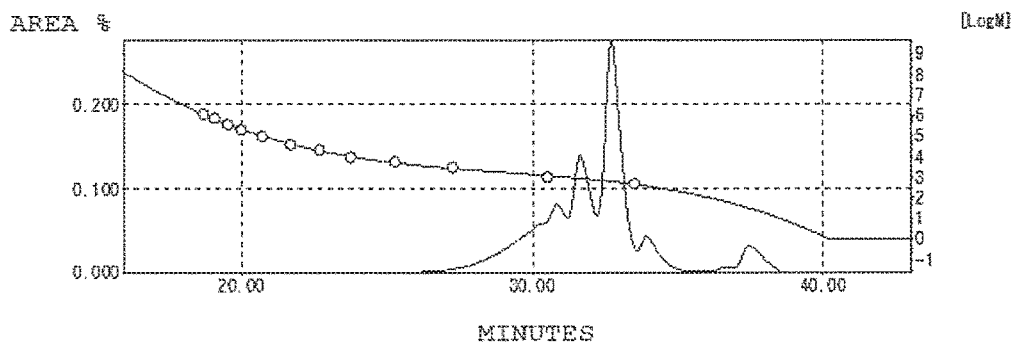
FIG. 14 shows a GPC chart of an epoxy resin obtained in Synthetic Example 12.

An epoxy resin (D-6) was obtained in the same manner as in Synthetic Example 2, except that 165 g of the phenol resin of Synthetic Example 1 was changed to 158 g of the phenol resin obtained in Synthetic Example 11. The obtained epoxy resin (D-6) had a softening point of 82° C. (B&R method) and an epoxy equivalent of 238 gi/eq. A GPC chart of the obtained epoxy resin (D-6) is shown in FIG. 14. From FIG. 14, the area ratio of the naphthol glycidyl ether compound (B) in the epoxy resin (D-6) in the GPC measurement was 0.6%, and the area ratio of the xanthene compound (C) in the GPC measurement was 5.3%.

[Synthetic Example 13] Synthesis of Epoxy Resin (D-7)

An epoxy resin (D-7) was obtained in the same manner as in Synthetic Example 2, except that 165 g of the phenol resin of Synthetic Example 1 was changed to 158 g (hydroxy group: 0.96 equivalent) of the phenol resin of Synthetic Example 1 and 6 g (hydroxy group: 0.04 equivalent) of α-naphthol. The obtained epoxy resin (D-7) had a softening point of 79° C. (B&R method) and an epoxy equivalent of 240 g/eq. Although not shown, the area ratio of the naphthol glycidyl ether compound (B) in the epoxy resin (D-7) in the GPC measurement was 5.4%, and the area ratio of the xanthene compound (C) in the GPC measurement was 3.4%.

[Comparative Synthetic Example 1] Synthesis of Phenol Resin

In a flask equipped with a thermometer, a dropping funnel, a condenser tube, a fractionating column, and a stirrer, while being purged with nitrogen gas, 505 g (3.50 mol) of α-naphthol, and 158 g of water, 5 g of oxalic acid were charged, and the mixture was stirred which raising the temperature from room temperature to 100° C. over 45 minutes. Subsequently, 177 g (2.45 mol) of a 42 wt % formalin aqueous solution was added dropwise over 1 hour. After the completion of the dropwise addition, the mixture was further stirred at 1000 for 1 hour, and then the temperature was raised to 180° C. over 3 hours. After the completion of the reaction, under heat and reduced pressure, water vapor was blown to remove free α-naphthol, whereby 480 parts of a phenol resin was obtained. The obtained phenol resin had a softening point of 142° C. (B&R method) and a hydroxy group equivalent of 156 g/eq. Although not shown, in a GPC measurement of the obtained phenol resin, no peaks of α-naphthol monomer and the xanthene compound can be confirmed.

[Comparative Synthetic Example 2] Synthesis of Epoxy Resin (D'-1)

Next, in a flask equipped with a thermometer, a condenser tube, and a stirrer, while being purged with nitrogen gas, 156 g (hydroxy group: 1.0 equivalent) of the phenol resin obtained in the above reaction, 463 g (5.0 mol) of epichlorohydrin, and 53 g of n-butanol were charged and dissolved. After the temperature was raised to 50° C., 220 g (1.10 mol) of a 20% sodium hydroxide aqueous solution was added over 3 hours, and the mixture was then reacted at 50° C. for 1 hour. After the completion of the reaction, unreacted epichlorohydrin was removed by distillation at 150° C. under reduced pressure. To the obtained crude epoxy resin, 300 g of methyl isobutyl ketone and 50 g of n-butanol were added to dissolve the epoxy resin. After 15 g of a 10 wt % sodium hydroxide aqueous solution was added to the solution and the mixture was reacted at 80° C. for 2 hours, water washing with 100 g of water was repeated three times until the pH of the washing liquid became neutral. Then, the system was dehydrated by azeotropic distillation, and subjected to precise filtration, followed by removing the solvent by distillation under reduced pressure, whereby 202 g of an epoxy resin (D'-1) was obtained. The obtained epoxy resin (D'-1) had a softening point of 122° C. (B&R method) and an epoxy equivalent of 239 g/eq. Although not shown, in a GPC measurement of the obtained epoxy resin, no peaks of the naphthol glycidyl ether compound (B) and the xanthene compound (C) can be confirmed.

[Comparative Synthetic Example 3] Synthesis of Epoxy Resin (D'-2)

A phenol resin was obtained in the same manner as in Comparative Synthetic Example 1, except that the amount of α-naphthol was changed from 505 g (3.50 mol) to 6 g (hydroxy group: 0.04 equivalent). Next, an epoxy resin (D'-2) was obtained in the same manner as in Comparative synthetic Example 2, except that, in place of 156 g (hydroxy group: 1.0 equivalent) of the phenol resin of Comparative synthetic Example 1, 150 g (hydroxy group: 0.96 equivalent) of the phenol resin obtained above was used. The obtained epoxy resin (D'-2) had a softening point of 115° C. (B&R method) and an epoxy equivalent of 231 g/eq. Although not shown, in a GPC measurement of the obtained epoxy resin, the area ratio of the naphthol glycidyl ether compound (B) was 3.8%, and no peak of the xanthene compound (C) can be confirmed.

[Comparative Synthetic Example 4] Synthesis of Epoxy Resin (D'-3)

After 100 g of the epoxy resin (D-1) obtained in Synthetic Example 2 was dissolved in 100 g of methyl isobutyl ketone, water vapor was blown under heat and reduced pressure to remove the solvent and the naphthol glycidyl ether compound (B), whereby an epoxy resin (D'-3) was obtained. The obtained epoxy resin (D'-3) had a softening point of 87° C. (B&R method) and an epoxy equivalent of 244 g/eq. Although not shown, in a GPC measurement of the obtained epoxy resin, no peak of the naphthol glycidyl ether compound (B) can be confirmed, and the area ratio of the xanthene compound (C) was 3.6%.

[Comparative Synthetic Example 5] Synthesis of Epoxy Resin (D'-4)

In a 2 L flask equipped with a stirrer, a condenser, and a thermometer, 405 g of 1-naphthol, 298 g of phenol, and 228 g of a 37% formalin aqueous solution were placed, and the temperature was raised to 100° C. in an oil bath to reflux the reaction mixture for 1 hours. Next, 2 ml of 2N hydrochloric acid was added and reacted at a temperature at which water in the system refluxes for 4 hours, and then the temperature was raised to 165° C. to continue the reaction for 12 hours. Subsequently, the reaction solution was heated and concentrated at 20000 under reduced pressure for 4 hours, whereby a phenol resin was obtained. Then, in a flask equipped with a thermometer, a condenser tube, and a stirrer, while being purged with nitrogen gas, 174 g (hydroxy group: 1.0 equivalent) of the phenol resin obtained in the above reaction, 463 g (5.0 mol) of epichlorohydrin, and 53 g of n-butanol were charged and dissolved. After the temperature was raised to 50° C., 220 g (1.10 mol) of a 20% sodium hydroxide aqueous solution was added over 3 hours, and the mixture was then reacted at 50° C. for 1 hour. After the completion of the reaction, unreacted epichlorohydrin was removed by distillation at 150° C. under reduced pressure. To the obtained crude epoxy resin, 300 g of methyl isobutyl ketone and 50 g of n-butanol were added to dissolve the epoxy resin. After 15 g of a 10 wt % sodium hydroxide aqueous solution was further added to the solution and the mixture was reacted at 80° C. for 2 hours, water washing was repeated with 100 g of water three times until the pH of the washing liquid became neutral. Then, the system was dehydrated by azeotropic distillation, and subjected to precise filtration, followed by removing the solvent by distillation under reduced pressure, whereby an epoxy resin (D'-4) was obtained. The obtained epoxy resin (D'-4) had a softening point of 62° C. (B&R method) and an epoxy equivalent of 261 g/eq. Although not shown, the naphthol glycidyl ether compound (B) was 3.8% in a GPC measurement, and the area ratio of the xanthene compound (C) in the GPC measurement was 18.9%.

[Comparative Synthetic Example 6] Synthesis of Epoxy Resin (D'-5)

At 150° C., 100 g of the epoxy resin (D'-1) obtained, in Comparative synthetic Example 2 and 50 g of the epoxy resin (D'-4) obtained in Comparative synthetic Example 5 were melt mixed, whereby an epoxy resin (D'-5) was obtained. The obtained epoxy resin (D'-5) had a softening point of 96° C. (B&R method) and an epoxy equivalent of 246 g/eq. Although not shown, the naphthol glycidyl ether compound (B) was 1.3% in a GPC measurement, and the area ratio of the xanthene compound (C) in the GPC measurement was 6.3%.

[Examples 1 to 7, Comparative Examples 1 to 5]
Production of Compositions and Laminated Plates The following compounds were blended at ratios shown in Table 1 and Table 2, and adjusted with methyl ethyl ketone so that the final non-volatile content (N.V.) in the composition was 58 wt %.
D-1: epoxy resin obtained in Synthetic Example 2
D-2: epoxy resin obtained in Synthetic Example 4
D-3: epoxy resin obtained in Synthetic Example 6
D-4: epoxy resin obtained in Synthetic Example 7
D-5: epoxy resin obtained in Synthetic Example 10
D-6: epoxy resin obtained in Synthetic Example 12
D-7: epoxy resin obtained in Synthetic Example 13
D'-1: epoxy resin obtained in Comparative synthetic Example 2
D'-2: epoxy resin obtained in Comparative synthetic Example 3
D'-3: epoxy resin obtained in Comparative synthetic Example 4
D'-4: epoxy resin obtained in Comparative synthetic Example 5
D'-5: epoxy resin obtained in Comparative synthetic Example 6
E-1: a phenol resin
   TD-2090 manufactured by DIC Corporation,
   phenol novolac type phenol resin, hydroxy group equivalent: 105 g/eq
F-1: curing accelerator
   2-ethyl-4-methyl imidazole Next, laminated plates were experimentally produced by curing under the following conditions, and the laminated plates were evaluated for heat resistance, moisture absorption rate, thermal expansion coefficient, and shrinkage rate after thermal history according to the following methods. The results are shown in Table 1 and Table 2.
<Production Condition of Laminated Plate>
   Substrate: glass cloth "#2116" (210×280 mm), manufactured by Nitto Boseki Co. Ltd.
   Ply number: 6
   Condition for forming prepreg: 160° C.
   Conditions for curing: 200° C., 40 kg/cm² 1.5 hours
   Thickness of molded plate: 0.8 mm <Heat Resistance Test>
The cured product of the laminated plate produced above having a thickness of 0.8 mm was cut into a size of 5 mm width and 54 mm length to prepare a test piece 1. The test piece 1 was evaluated for glass transition temperature, by using a viscoelasticity meter (DMA: solid viscoelasticity meter "RSAII", manufactured by Rheometric, rectangular tension method: frequency 1 Hz, temperature raising rate 3° C./min), with the temperature at which change in viscoelasticity is maximum (the rate of change in tan δ is maximum) taken as the glass transition temperature.
<Moisture Absorption Rate>
According to JIS-C-6481, by using a pressure cocker tester "PC-304RIII", manufactured by Hirayama Manufacturing Corp., the masses before and after storage for 4 hours under conditions of 121° C., 100% humidity, and 2 atoms were measured, and the change in mass was calculated as a moisture absorption rate.
<Thermal Expansion Coefficient>
The laminated plate was cut into a size of 5 mm×5 mm×0.8 mm to prepare a test piece 2, and the test piece 2 was subjected to thermomechanical analysis using a thermomechanical analyzer (TMA: SS-6100, manufactured by Seiko Instruments Inc.) in the following compaction mode. Incidentally, the measurement under the following conditions was conducted twice for one sample, and the mean linear expansion coefficient in the temperature range of 40° C. to 60° C. in the second measurement was taken as the coefficient of thermal expansion and evaluated.
   Measurement Conditions
   Measurement load: 88.8 mN
   Temperature raising rate: 10° C./min×twice
   Measurement temperature range: from −50° C. to 300° C.
<Rate of Change in Size of Laminated Plate Before and After Thermal History>
The test piece 2 obtained by cutting the laminated plate into a size of 5 mm×5 mm×0.8 mm was subjected to a thermomechanical analysis using a thermomechanical analyzer (TMA: SS-6100 manufactured by Seiko Instruments Inc.) in the following compaction mode. Incidentally, the measurement under the following conditions was conducted twice for one sample, and the difference of position of the probe at 30° C. between the first and second measurements was divided by the initial thickness of the test piece 2 and the calculation result was taken as the shrinkage rate after thermal history and evaluated.
   Measurement load: 88.8 mN
   Temperature raising rate: 3° C./min×twice
   Measurement temperature range: from −30° C. to 260° C.

TABLE 1

|  | Example 1 | Example 2 | Example 3 | Example 4 | Example 5 | Example 6 | Example 7 |
|---|---|---|---|---|---|---|---|
| D-1 (g) | 69.7 | | | | | | |
| D-2 (g) | | 68.7 | | | | | |
| D-3 (g) | | | 69.2 | | | | |
| D-4 (g) | | | | 70.3 | | | |
| D-5 (g) | | | | | 69.0 | | |
| D-6 (g) | | | | | | 69.4 | |
| D-7 (g) | | | | | | | 69.6 |
| E-1 (g) | 30.3 | 31.3 | 30.8 | 29.7 | 31.0 | 30.6 | 30.4 |
| F-1 (g) | 0.05 | 0.05 | 0.05 | 0.05 | 0.05 | 0.05 | 0.05 |
| | Evaluation of physical properties | | | | | | |
| Tg (° C.) | 222 | 220 | 220 | 219 | 230 | 220 | 217 |
| Moisture absorption rate (%) | 0.51 | 0.53 | 0.52 | 0.49 | 0.53 | 0.52 | 0.53 |

TABLE 1-continued

|  | Example 1 | Example 2 | Example 3 | Example 4 | Example 5 | Example 6 | Example 7 |
| --- | --- | --- | --- | --- | --- | --- | --- |
| Coefficient of thermal expansion (ppm) | 48 | 49 | 48 | 48 | 49 | 49 | 50 |
| Shrinkage rate after thermal history (%) | 0.16 | 0.17 | 0.16 | 0.15 | 0.16 | 0.16 | 0.18 |

TABLE 2

|  | Comparative Example 1 | Comparative Example 2 | Comparative Example 3 | Comparative Example 4 | Comparative Example 5 |
| --- | --- | --- | --- | --- | --- |
| D'-1 (g) | 69.5 | | | | |
| D'-2 (g) | | 68.8 | | | |
| D'-3 (g) | | | 69.9 | | |
| D'-4 (g) | | | | 71.3 | |
| D'-5 (g) | | | | | 70.1 |
| E-1 (g) | 30.5 | 31.2 | 30.1 | 28.7 | 29.9 |
| F-1 (g) | 0.05 | 0.05 | 0.05 | 0.05 | 0.05 |
| Evaluation of physical properties | | | | | |
| Tg (° C.) | 230 | 227 | 222 | 192 | 215 |
| Moisture absorption rate (%) | 0.71 | 0.69 | 0.65 | 0.59 | 0.67 |
| Coefficient of thermal expansion (ppm) | 51 | 53 | 53 | 53 | 52 |
| Shrinkage rate after thermal history (%) | 0.34 | 0.31 | 0.29 | 0.20 | 0.29 |

The invention claimed is:

1. An epoxy resin, comprising as essential components, a cresol-naphthol co-condensed novolac epoxy resin (A), a naphthol glycidyl ether compound (B), and one or more xanthene compounds (C) selected from the group of compounds represented by the following structural formulae (1) to (3), wherein the content of the xanthene compound(s) (C) is from 0.1% to 5.5% in terms of area ratio in a GPC measurement:

[Chem. 1]

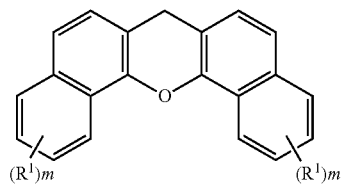

(1)

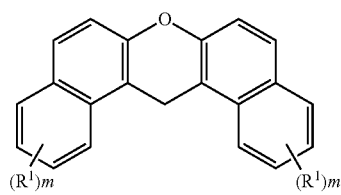

(2)

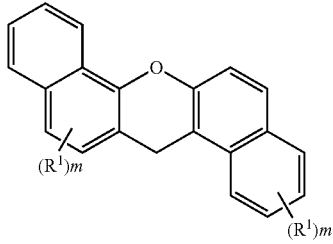

(3)

wherein in the structural formulae (1) to (3), R' each independently represent a hydrogen atom, an alkyl group having 1 to 4 carbon atoms, or an alkoxy group having 1 to 4 carbon atoms, m each independently represents an integer of 1 to 6, wherein the content of the glycidyl ether compound (B) is from 0.1% to 4.0% in terms of area ratio in a GPC measurement.

2. A curable resin composition comprising the epoxy resin as set forth in claim 1 and a curing agent as essential components.

3. A cured product, which is obtained by curing the curable resin composition as set forth in claim 2.

4. A semiconductor device using the curable resin composition as set forth in claim 2.

5. A prepreg using the curable resin composition as set forth in claim 2.

6. A fiber-reinforced composite material, which comprises the curable resin composition as set forth in claim 2 and a reinforcing fiber.

7. A fiber-reinforced molded article, which is obtained by curing the fiber-reinforced composite material as set forth in claim 6.

8. An epoxy resin, comprising as essential components, a cresol-naphthol co-condensed novolac epoxy resin (A), a naphthol glycidyl ether compound (B), and one or more xanthene compounds (C) selected from the group of compounds represented by the following structural formulae (1) to (3), wherein the content of the xanthene compound(s) (C) is from 0.1% to 5.5% in terms of area ratio in a GPC measurement:

[Chem. 1]

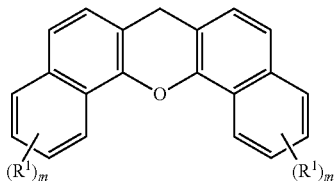

(1)

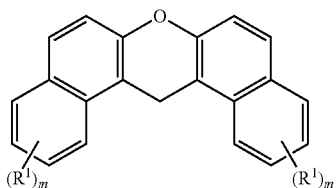

(2)

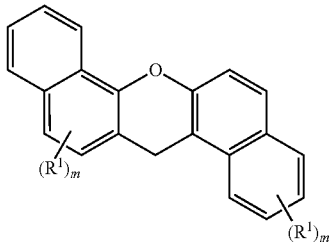

(3)

wherein in the structural formulae (1) to (3), $R^1$ each independently represent a hydrogen atom, an alkyl group having 1 to 4 carbon atoms, or an alkoxy group having 1 to 4 carbon atoms, m each independently represents an integer of 1 to 6, wherein the total content of the glycidyl ether compound (B) and the xanthene compound(s) (C) is from 1.0% to 8.0% in terms of area ratio in a GPC measurement.

9. A curable resin composition comprising the epoxy resin as set forth in claim 8 and a curing agent as essential components.

10. A cured product, which is obtained by curing the curable resin composition as set forth in claim 9.

11. A semiconductor device using the curable resin composition as set forth in claim 9.

12. A prepreg using the curable resin composition as set forth in claim 9.

13. A fiber-reinforced composite material, which comprises the curable resin composition as set forth in claim 9 and a reinforcing fiber.

* * * * *